United States Patent [19]

Inoue et al.

[11] Patent Number: 5,233,233
[45] Date of Patent: Aug. 3, 1993

[54] MULTIPLEXER FOR USE IN A FULL ADDER HAVING DIFFERENT GATE DELAYS

[75] Inventors: Yoshitsugu Inoue; Shinichi Uramoto; Shinichi Nakagawa, all of Hyogo, Japan

[73] Assignee: Mitsubishi Denki Kabushiki Kaisha, Tokyo, Japan

[21] Appl. No.: 781,611

[22] Filed: Oct. 23, 1991

[30] Foreign Application Priority Data

Nov. 5, 1990 [JP] Japan .................................. 2-300344

[51] Int. Cl.⁵ .................................. H03K 17/693
[52] U.S. Cl. .................................. 307/243; 307/443; 307/472; 307/246; 307/594; 364/784
[58] Field of Search ............... 307/443, 451, 243, 246, 307/472, 574, 575, 594, 597, 601, 603; 364/784, 786-788

[56] References Cited

U.S. PATENT DOCUMENTS

| | | | |
|---|---|---|---|
| 4,031,379 | 6/1977 | Schwartz | 307/472 X |
| 4,371,797 | 2/1983 | Frank | 307/575 X |
| 4,541,067 | 9/1985 | Whitaker | 364/784 X |
| 4,730,266 | 3/1988 | van Meerbergen et al. | 307/472 X |
| 4,940,908 | 7/1990 | Tran | 307/243 X |
| 4,988,902 | 1/1991 | Dingwall | 307/246 X |

OTHER PUBLICATIONS

"Principles of CMOS VLSI Design", Neil H. E. Weste et al., pp. 202-203, 1985.

Primary Examiner—David R. Hudspeth
Attorney, Agent, or Firm—Lowe, Price, LeBlanc & Becker

[57] ABSTRACT

The semiconductor integrated circuit device includes a select gate for selectively transmitting a signal. The select gate includes a first gate for receiving and transferring a first logic signal to an output node, and a second gate for receiving and transferring a second logic signal to the output node. The first and second gates turn on complementarily to each other. The first gate has an output load capacitance viewed from the output node less than that of the second gate. The first gate receives, as the first logic signal, a signal not required to be transmitted at a high speed, or a signal of a predetermined logic level or a fixed level. The second gate receives, as the second signal, a signal to be transmitted at a high speed. Since the second gate has a less output load capacitance, the second gate is allowed to transmit a signal at a high speed.

41 Claims, 19 Drawing Sheets

FIG.3 PRIOR ART

| A | AB | B | BB | C | CB | PG | PGB | TG11 | TG12 | TG13 | TG14 | S | SB | CO | COB | A+B+C |
|---|----|---|----|---|----|----|----|------|------|------|------|---|----|----|----|-------|
| 0 | 1 | 0 | 1 | 0 | 1 | 0 | 1 | OFF | ON | ON | OFF | 0 | 1 | 0 | 1 | 00 |
| 0 | 1 | 0 | 1 | 1 | 0 | 0 | 1 | OFF | ON | ON | OFF | 1 | 0 | 0 | 1 | 01 |
| 1 | 0 | 1 | 0 | 0 | 1 | 0 | 1 | OFF | ON | ON | OFF | 0 | 1 | 1 | 0 | 10 |
| 1 | 0 | 1 | 0 | 1 | 0 | 0 | 1 | OFF | ON | ON | OFF | 1 | 0 | 1 | 0 | 11 |
| 0 | 1 | 1 | 0 | 0 | 1 | 1 | 0 | ON | OFF | OFF | ON | 1 | 0 | 0 | 1 | 01 |
| 0 | 1 | 1 | 0 | 1 | 0 | 1 | 0 | ON | OFF | OFF | ON | 0 | 1 | 1 | 0 | 10 |
| 1 | 0 | 0 | 1 | 0 | 1 | 1 | 0 | ON | OFF | OFF | ON | 1 | 0 | 0 | 1 | 01 |
| 1 | 0 | 0 | 1 | 1 | 0 | 1 | 0 | ON | OFF | OFF | ON | 0 | 1 | 1 | 0 | 10 |

FIG.12

| A | AB | B | BB | C | CB | PG | PGB | TG11 | TG12 | TG13 | TG14 | SB | S | CO | COB | A+B+C |
|---|----|---|----|---|----|----|-----|------|------|------|------|----|---|----|-----|-------|
| 0 | 1 | 0 | 1 | 0 | 1 | 0 | 1 | ON | OFF | OFF | OFF | 1 | 0 | 0 | 1 | 00 |
| 0 | 1 | 0 | 1 | 1 | 0 | 0 | 1 | ON | OFF | ON | OFF | 0 | 1 | 0 | 1 | 01 |
| 1 | 0 | 1 | 0 | 0 | 1 | 0 | 1 | ON | OFF | ON | OFF | 1 | 0 | 1 | 0 | 10 |
| 1 | 0 | 1 | 0 | 1 | 0 | 0 | 1 | ON | OFF | ON | OFF | 0 | 1 | 1 | 0 | 11 |
| 0 | 1 | 1 | 0 | 0 | 1 | 1 | 0 | OFF | ON | OFF | ON | 0 | 1 | 0 | 1 | 01 |
| 0 | 1 | 1 | 0 | 1 | 0 | 1 | 0 | OFF | ON | OFF | ON | 1 | 0 | 1 | 0 | 10 |
| 1 | 0 | 0 | 1 | 0 | 1 | 1 | 0 | OFF | ON | OFF | ON | 0 | 1 | 0 | 1 | 01 |
| 1 | 0 | 0 | 1 | 1 | 0 | 1 | 0 | OFF | ON | OFF | ON | 1 | 0 | 1 | 0 | 10 |

| | | GATE WIDTH OF TRANSISTOR Q2 OF GATE CIRCUIT TG13' |
|---|---|---|
| LSB | FULL ADDER #1 | 8 W |
| | " #2 | 7 W |
| | " #3 | 6 W |
| | " #4 | 5 W |
| | " #5 | 4 W |
| | " #6 | 3 W |
| | " #7 | 2 W |
| MSB | " #8 | W |

|  | GATE WIDTH OF TRANSISTOR Q2 OF GATE CIRCUIT TG13' |
|---|---|
| LSB  FULL ADDER #1 | 8 W |
| " #2 | 8 W |
| " #3 | 8 W |
| " #4 | 8 W |
| " #5 | 4 W |
| " #6 | 4 W |
| " #7 | 4 W |
| MSB  " #8 | 4 W |

FIG.23

| | GATE WIDTH OF TRANSISTOR Q2 OF GATE CIRCUIT TG7' |
|---|---|
| CARRY LOOK AHEAD CIRCUIT #1 | 10 W |
| " #2 | 9 W |
| " #3 | 8 W |
| " #4 | 7 W |
| " #5 | 6 W |
| " #6 | 5 W |
| " #7 | 4 W |
| " #8 | 3 W |
| " #9 | 2 W |
| " #10 | W |

LOW ORDER ↑ ↓ HIGH ORDER

FIG.24

|  | GATE WIDTH OF TRANSISTOR Q2 OF GATE CIRCUIT TG7' |
|---|---|
| CARRY LOOK AHEAD CIRCUIT #1 | 10 W |
| " #2 | 10 W |
| " #3 | 10 W |
| " #4 | 10 W |
| " #5 | 10 W |
| " #6 | 5 W |
| " #7 | 5 W |
| " #8 | 5 W |
| " #9 | 5 W |
| " #10 | 5 W |

MULTIPLEXER FOR USE IN A FULL ADDER HAVING DIFFERENT GATE DELAYS

BACKGROUND OF THE INVENTION

1. Field of the Invention

The present invention relates generally to semiconductor integrated circuits of which high-speed operation is required, and more particularly, to semiconductor integrated circuits having a function of selecting one signal among a plurality of input signals, semiconductor integrated circuits having a full adding function and semiconductor integrated circuits comprising addition circuits having a carry look ahead function.

2. Description of the Related Art

A semiconductor integrated circuit includes a logic circuit for implementing a selection function, an addition function or a product function. In general, such a logic circuit employs a lot of transmission gates.

FIG. 1 is a diagram showing a construction of a conventional two-input selection circuit, which is disclosed in, for example, "Principle of CMOS VLSI.Design", published by Adison-Wesley Publishing Company, 1985, pp. 202.

In FIG. 1, the two-input selection circuit comprises a gate circuit TG1 for transmitting an input signal A received at an input node 1a to an output node 2 in response to selection signals SEL and SELB, and a gate circuit TG2 for transmitting an input signal B received at an input node 1b to output node 2 in response to control signals SEL and SELB.

Gate circuits TG1 and TG2 have the same construction and each comprises a p channel MOS transistor (p channel insulated gate type field effect transistor) Q1 and an n channel MOS transistor Q2. P channel MOS transistor Q1 of gate circuit TG1 has a gate receiving control signal SEL and p channel MOS transistor Q1 of gate circuit TG2 has a gate receiving control signal SELB.

N channel MOS transistor Q2 of gate circuit TG1 has a gate receiving complementary control signal SELB and n channel MOS transistor Q2 of gate circuit TG2 has a gate receiving control signal SEL.

Both of input signals A and B are binary logic signals assuming a logical value "1" or "0". In the following description, logic signals represented in binary form with logic "1" and "0" are simply referred to as logic signals.

Control signal SEL attains the logical value "1" or "0". Complementary control signal SELB is a negation signal of control signal SEL. More specifically, complementary control signal SELB attains the logical value "0" when control signal SEL attains the logical value "1" and attains the logical value "1" when control signal SEL attains the logical value "0".

Although the logic "1" and "0" can correspond to either of "H" and "L" potentials, it is assumed in the following description that logic "1" corresponds to an "H" potential and logic "0" to an "L" potential. Operation will be described in the following.

When control signal SEL is at "0", gate circuit TG1 is turned on (in a conductive state) and gate circuit TG2 is turned off (in a cut-off state). Logic signal A, out of logic signals A and B respectively input to input nodes 1a and 1b, is selected and transmitted to output node 2 through gate circuit TG1.

When control signal SEL is at "1", gate circuit TG1 is turned off, and gate circuit TG2 is turned on. In this case, logic signal B, out of input logic signals A and B, is transmitted to output node 2 through gate circuit TG2. In other words, the two-input selection circuit shown in FIG. 1 functions to select either of input logic signals A and B and output the selected logic signal as an output signal Z to output node 2.

FIG. 2 is a diagram showing a construction of a conventional full addition circuit, which is disclosed in, for example, Japanese Patent Publication No. 55-1619. In FIG. 2, the full addition circuit comprises an exclusive OR circuit 20a for receiving first and second logic signals A and B respectively applied to input nodes 1a and 1b to generate a control signal PG, an exclusive NOR circuit 20b for receiving first and second logic signals A and B to generate a complementary control signal PGB, an inverter circuit 13 for receiving a third logic signal C applied to an input node 1c and an inverter 14 for receiving logic signal A.

Exclusive OR circuit 20a generates a signal of "1" when logical values of logic signals A and B are different from each other. Exclusive NOR circuit 20b outputs a signal of "1" when the logical values of logic signals A and B are the same.

The full addition circuit further comprises a first gate circuit TG11 for selectively passing logic signal C to an output node 4a' in response to control signals PG and PGB, a second gate circuit TG12 for selectively transmitting an output signal CB from inverter circuit 13 to output node 4a' in response to control signals PG and PGB, a third gate circuit TG13 for selectively transmitting an output signal AB from inverter circuit 14 to an output node 4b' in response to control signals PG and PGB, and a fourth gate circuit TG14 for selectively transmitting output signal CB from inverter circuit 13 to output node 4b' in response to control signals PG and PGB.

Gate circuits TG11-TG14 have the same arrangement with each other, which is formed by a parallel connection of a p channel MOS transistor Q1 and an n channel MOS transistor Q2. Each gate of MOS transistors Q1 and Q2 receives control signal PG or PGB.

Gate circuit TG11 and gate circuit TG14 simultaneously become conductive and gate circuits TG12 and TG13 simultaneously become conductive. Gate circuits TG11, TG14 and gate circuits TG12, TG13 are turned on in a complementary manner.

A logic signal SB transmitted to output node 4a' is converted into an output logic signal S by an inverter circuit 15a. An output logic signal COB transmitted to output node 4b' is converted into an output logic signal CO by an inverter circuit 15b. Logic signals S and CO respectively transmitted to output nodes 4a and 4b are logic signals indicative of a first order digit and a second order digit of an addition result (A+B+C) of first to third logic signals A, B and C, respectively. Herein, a first order digit corresponds to a less significant bit and a second order digit corresponds to a more significant bit.

FIG. 3 is a table showing a relation between input logic signals and output logic signals of the full addition circuit shown in FIG. 2. FIG. 3 also shows control signals generated in this full addition circuit and operation states of the respective gate circuits. Operation will be briefly described in the following.

When input logic signals A and B attain the same logical value, control signal PG from exclusive OR circuit 20a goes to "0", while control signal PGB from exclusive NOR circuit 20b goes to "1". As a result, gate circuits TG12 and TG13 are turned on. Under this state, output logic signals CB and AB from inverter circuits 13 and 14 are transmitted to output nodes 4a' and 4b', respectively.

In other words, when logic signal A and logic signal B are equal in logical value to each other, a bit value S of a first order digit of an addition result on three input logic signals A, B and C is determined by a logic signal C. In this case, therefore, an output signal CB from inverter circuit 13 is selected as data for the first order digit and transmitted to output node 4a'.

For a more significant bit, when logic signal A is at "0", a second order digit of the addition result (A+B+C) provides a bit value of "0", and when logic signal A is at "1", the second order digit of the addition result (A+B+C) provides "1". In this case, therefore, output logic signal AB from inverter circuit 14 is transmitted to output node 4b'.

With logic signals A and B are different from each other, the addition result (A+B) is "1". In this case, a bit value of the first order digit of the sum of the three input logic signals (A+B+C) is equivalent to an inversion of third logic signals C. In this case, therefore, gate circuit TG11 is turned on in response to control signal PGB to select third logic signal C which is transmitted to output node 4a'.

In this case, the value of the second order digit of the addition result (A+B+C) is equal to a logical value of logic signal C. Therefore, output logic signal CB from inverter circuit 13 is selected by gate circuit TG14 and transmitted to output node 4b' in this case.

FIG. 4 is a diagram showing a construction of an n-bit full addition circuit for implementing a parallel addition of n bit binary numbers by using the full addition circuit shown in FIG. 2. In FIG. 4, the full addition circuit comprises n full adders F1–Fn. Each of the full adders F1–Fn has the same construction as that of the full addition circuit shown in FIG. 2.

Each of the full adders F1–Fn comprises logic signal input nodes 1a, 1b, and 1c and logic signal output nodes 4a and 4b. Full adder Fi (i=1–n) receives an i-th bit Ai of logic signal A at its input node 1a. Full adder Fi also receives an i-th bit Bi of logic signal B at its input node 1b and a carry output COi-1 from a full adder Fi-1 in the preceding or lower bit stage at its input node 1c. Full adder Fi outputs an i-th bit Si of the addition result S from its output node 4a and a carry output COi from its output node 4b. A carry input signal CI set to a fixed value (for example, logic "0") is applied to a carry input node 1c of full adder F1 in the first or the least significant bit stage.

Operation of the n-bit full addition circuit shown in FIG. 4 can be obtained by arranging the full addition circuits shown in FIG. 2 in an n-bit parallel fashion and connecting output bit COi of the second order digit with carry input IC of a full adder of a next more significant bit in a subsequent stage, a manner of which operation can be easily understood. In other words, the full addition circuit shown in FIG. 4 adds each bit at the same order of n-bit logic signals A and B. Carry generated at each bit is transmitted to a full adder of a next more significant bit to obtain an n-bit output signal S and a 1-bit carry output COn.

In FIG. 4, carry output COi is transmitted to a full adder of a next more significant bit, i+1, and operation time of the full addition circuit is determined by a propagation time period of such a carry output. In order to reduce the delay caused by this carry propagation, a full addition circuit having a carry look ahead function is often used.

FIG. 5 is a diagram showing a constitution of a conventional N-bit binary addition circuit having a carry look ahead function. In FIG. 5, N-bit binary addition circuit having a carry look ahead function comprises a plurality of stages each including at least three bits. In FIG. 5, each stage is shown in a block, and three blocks 31, 32 and 33 are illustrated as representatives. A single block may be provided in the full addition circuit. Carry look ahead circuit 41, 42 and 43 are provided corresponding to respective blocks 31–33. Each carry look ahead circuit receives a control signal from the corresponding block and a carry output from a full adder of the most significant bit in the corresponding block to determine whether carry should be caused in the block or not.

The output from a carry look ahead circuit is transmitted to a carry look ahead circuit in a higher order block as well as transmitted as a carry input to an addition block at a next higher order.

In the addition circuit shown in FIG. 5, the following operation is carried out. Where a carry input signal in a certain stage is transmitted through all full adders in the certain stage, the corresponding carry look ahead circuit outputs a carry signal to the subsequent stage before the carry signal is propagated throughout a transmission path including a chain of the full adders and then the carry out is output from the full adder of the most significant bit in the certain stage. As a result, a carry propagation delay is reduced.

FIG. 6 is a diagram showing a construction of second block 32 and carry look ahead circuit 42 shown in FIG. 5. Respective blocks and carry look ahead circuits in FIG. 5 have the same constructions as those shown in FIG. 6.

In FIG. 6, addition block 32 has the same construction as that of the full addition circuit shown in FIG. 4 and includes n full adders 50-1–50-n arranged in parallel for full addition of n-bits. A full adder 50-1 (i=1–n) comprises an input node 1a for receiving (m+i)th bit Am+i of logic signal A, an input node 1b for receiving (m+i)th bit Bm+i of logic signal B and an input node 1c for receiving a carry output COm+i-1 from a full adder of the next lower order bit. Full adder 51-i further includes an output node 4a for an addition Sm+i, an output node 4b for a carry COm+i and a control signal output node 4c for generating a control signal PG.

Control signals PGm+1–PGm+n respectively output from all the adders 50-1–50n are applied to a carry selection control signal generation circuit 30 included in carry look ahead circuit 42.

Carry selection control signal generation circuit 30 includes a logical product circuit for obtaining a logical product of control signals PGm+1–PGm+n. Carry selection control signal generation circuit 30 sets control signal SEL to logic "1" and control signal SELB to logic "0" when all the control signals PGm+1–PGn are at a logic "1" state. When at least one of control signals PGm+1–PGm+n is at a logic "0" state, carry selection control signal generation circuit 30 sets control signal SEL to logic "0". In other words, carry selection control signal generation circuit 30 sets control signal SEL to logic "1" when a carry signal is sequentially transmitted throughout all the full adders in addition block 32.

Carry look ahead circuit 42 further comprises gate circuits TG7 and TG8 for selectively passing either a carry signal COm+n of the most significant bit in addition block 32 or a carry input CI applied to full adder 50-1 of the least significant bit in response to control signals SEL and SELB from carry selection control signal generation circuit 30. Gate circuits TG7 and TG8 have the same arrangement comprising a parallel connection of a p channel MOS transistor Q1 and an n channel MOS transistor Q2. Each of gate circuits TG7 and TG8 is structured similarly to the selection circuit shown in FIG. 1.

When control signal SEL is at "1", gate circuit TG8 is turned on to transmit carry input CI as a carry signal CO to an output node 4. When control signal SEL is at "0", gate circuit TG7 is turned on to transmit carry output COm+n as carry signal CO to output node 4. Operation will now be described in the following.

Control signals PGm+1-PGm+n are carry propagation instructing signals each indicative of whether a carry is to be propagated or not in a corresponding adder. All the control signals PGm+1-PGm+n being at "1" indicate the carry input CI is transmitted throughout all the full adders 50-1-50-n. In this case, selection control signal SEL from carry selection control signal generation circuit 30 goes to "1" to transmit the carry signal CI as a carry out signal CO to a block in the subsequent stage through gate circuit TG8.

It is now assumed that one of the input logic signals in each of respective full adders 50-1-50-n is at "1" and the other at "0". In this case, all of PGm+1-PGm+n go to "1". (Control signal PGm+i is generated from EX-OR circuit 20a of FIG. 2). More specifically, in this state, when a carry signal CI at "1" is applied ahead circuit in the preceding stage, carry output COm+1 of full adder 1 (50-1) is first determined and is sequentially transmitted through all the full adders of more significant bits, resulting in generation of a corresponding carry signal COm+n from full adder 50-n of the most significant bit in this stage.

Such transmission of the carry signal CI through all the full adders 50-1-50-n is simultaneously determined by exclusive OR circuits included in full adders 50-1-50-n. Control signals (carry propagation instructing signals) PGm+1-PGm+n are output based on the respective determination results. Control signals PGm+n-PGm+1 are applied in parallel to carry selection control signal generation circuit 30.

Therefore, selection control signal SEL from carry selection control signal generation circuit 30 designates a carry propagation state to turn on gate circuit TG8 before carry signal CI is propagated through all the full adders 50-1-50-n. Carry signal CI input to full adder 50-1 of the least significant bit is transmitted to output node 4 as a carry input for a block in the subsequent stage through the on-state gate circuit TG8.

When both of the input logic signals in at least one of the full adders are at "1" or "0", a control signal PGm+j from the full adder reaches "0". In this state, gate circuit TG7 is turned on and gate circuit TG8 is turned off, whereby a carry signal COm+n from the full adder 50-n of the most significant bit is selected and output from output node 4 as a carry signal CO for a block in the subsequent stage.

As described in the foregoing, carry selection control signal generation circuit 30 makes a determination as to whether a carry signal should be propagated through all the full adders or not and enables transmission of the carry signal to a subsequent stage before output states of all the full adders 50-1-50-n are settled, thereby performing the addition of multi-bit logic signals at a high speed.

FIG. 7 shows constructions of first stage block 31 and corresponding carry look ahead circuit 41 in the N bit full addition circuit shown in FIG. 5. The circuit arrangement and operation thereof are the same as those of the circuit shown in FIG. 6 with the only difference being that a carry signal CI applied to the full adder 51-1 of the least significant bit is fixed to "0" of a ground potential level. Therefore, no detailed description will be given to the arrangement and operation of the circuit of FIG. 7.

In the first stage block shown in FIG. 7, the operation is only different from the operation of the circuit shown in FIG. 6 in that "0" state carry signal CO is transmitted to a block in the second stage when selection control signal SEL from carry selection control signal generation circuit 30 reaches "1".

A transmission gate constituted by a parallel connection of a p channel MOS transistor and an n channel MOS transistor generally has a characteristic that an input signal applied to an input node is transmitted to an output node without signal loss when it is ON and that the input node and the output node are reliably electrically cut off when it is OFF.

A change in an output of a certain circuit is equivalent to charging or discharging of load capacitance existing at the output of the circuit. It is therefore necessary to charge/discharge the output load capacitance at a high speed to rapidly cause the output change of the circuit.

In general, it is known that for speeding up an operation of a logic circuit formed using a MOS transistor, it is important to increase current drivability of the MOS transistor and reduce load capacitance of the same.

As shown in FIG. 8A, a MOS transistor comprises high concentration impurity regions 101 and 102 formed at the surface of a semiconductor substrate 100 and a conductive layer 103 formed on the surface of semiconductor substrate 100. Conductive layer 103 is referred to as a gate electrode and high concentration impurity regions 101 and 102 as source and drain regions. In an ordinary MOS transistor, which high concentration impurity region is used as a source region is determined according to the use of the transistor. In the following description, high concentration impurity region 101 connected to an output node is referred to as a drain region and high concentration impurity region 102 connected to an input node as a source region.

Gate electrode 103 is formed above a channel region between source and drain regions 101 and 102 with a gate insulation film 104 provided therebetween. Gate electrode 103 and drain region 101, and gate electrode 103 and source region 102 are electrically insulated by gate insulation film 104. Although not shown specifically, an interlayer insulation film for isolating different electrode interconnections is formed on the surface of semiconductor substrate 100.

With an MOS transistor structured as described above, a gate insulation film and an interlayer insulation film cause parasitic capacitance C1 to be generated between gate electrode 103 and drain region 101, while junction capacitance C2 is generated between drain region 101 and semiconductor substrate 100.

FIG. 8B is a top plan view of the MOS transistor shown in FIG. 8A. In FIG. 8B, a hatched region shows a channel region. Ordinarily, source region 102 and drain region 101 are formed in a self-alignment manner with respect to gate electrode 103. In the arrangement shown in FIG. 8B, a gate width W of gate electrode 103 determines the widths of drain region 101 and source region 102. The gate width is adjusted to determine the size of a transistor. An equivalent circuit of the MOS transistor is shown in FIG. 8C.

As shown in FIG. 8C, parasitic capacitances C1 and C2 exist in the drain region of the MOS transistor. For charging/discharging of an output node of the MOS transistor, it is therefore necessary to charge and discharge not only a signal line (a signal line to the output node) but also parasitic capacitances C1 and C2.

In a case of a transmission gate formed of a parallel connection of a p channel MOS transistor and an n channel MOS transistor, parasitic capacitance associated with the p channel MOS transistor and parasitic capacitance associated with the n channel MOS transistor existing at the output node should be charged and discharged. The structure of the p channel MOS transistor can be obtained by setting a conductivity type of each region to the opposite type in FIG. 8A showing the sectional structure of the n channel MOS transistor.

With the selection circuit structured as shown in FIG. 1, gate circuits TG1 and TG2 has large parasitic capacitances at the respective portions connected to output node 2. When gate circuit TG1 is turned on, for example, input logic signal A transmitted through gate circuit TG1 should charge/discharge not only output node 2 but also the parasitic capacitance existing at the output portion of gate circuit TG2. It is therefore impossible to settle a signal potential of output node 2 at a high speed, resulting in an increased delay in signal propagation.

In particular, when either of input logic signals A and B should be constantly output at a higher speed (in a case of a carry signal, for example), when a logical value of either of the logic signals is fixed and when it is not particularly necessary to transmit either of the logic signals at a high speed, load capacitance at the output node of a non-selected gate circuit causes an increased delay in signal propagation.

A conventional full addition circuit has the construction as shown in FIGS. 2 and 4. In the full addition circuit as shown in FIG. 2, gate circuits TG11–TG14 are provided at the output node and large load capacitance exist at an output of each of the gate circuits TG11–TG14.

In general, in parallel addition of multi-bit binary numbers A and B, Ai and Bi of each respective order are simultaneously applied to a full adder which in turn receives a carry from a next lower order bit, which carry is added to the addition result of the bits Ai and Bi. The carry signal from a full adder is transmitted to a full adder in the subsequent stage. Therefore, in the parallel addition of multi-bit binary numbers, bits at the respective orders are simultaneously applied to corresponding full adders in parallel, while a carry signal is serially transferred through the full adders.

Therefore, addition in a more significant bit should be suspended until addition in a less significant bit is finished. The path for propagating the carry signal from the least significant bit to the most significant bit is the longest propagation path requiring the greatest propagation time period. The maximum propagation time period determines an operation time period of the full addition circuit.

It is therefore necessary to reduce a propagation time of this carry signal to the minimum. In the arrangement shown in FIG. 2, a carry signal C transmitted from a preceding stage to input node 1C is transmitted to output node $4b'$ through inverter circuit 13 and gate circuit TG14. A carry signal COB at the output node $4b'$ is transmitted to carry signal input node $1c$ of a full adder in the subsequent stage through inverter circuit $15b$. There exists another path for transmitting a signal to output node $4b'$. This path is used for transmitting logic signal A applied to input node $1a$ through inverter circuit 14 and gate circuit TG13.

In the arrangement of FIG. 2, reduction of an operation time of the full addition circuit requires a delay time at a path for transmitting the carry signal C to be smaller than that of a path for transmitting the logic signal A.

However, in a case in which gate circuit TG14 is turned on to transmit the carry signal C from the preceding stage to output node $4b'$, load capacitance existing at the output portion of the off-state gate circuit TG13 causes delay in transmission of the input carry signal C.

In addition, there exists a path for propagating a carry signal other than the above-described shortest carry signal propagation path. That is a transmission path from an adder to an adder at a subsequent stage. In general, the higher is the order of a bit at which a chain for a carry signal (a path for serially transmitting the carry signal) starts, the shorter is the time which the carry signal requires for its propagation through the chain. As long as a time required for the propagation of the carry signal through the chain is equal to or shorter than the time period required for the propagation through the longest carry signal propagating path (a path for the propagation through all the full adders), performance in operating speed of the addition circuit as a whole is not deteriorated even if a time required for propagating the carry signal through the chain is increased.

However, with a transistor size of gate circuit TG13 being equal in all the full adders, parasitic capacitance existing at an output node in each full adder becomes equal. Therefore, in this case, the same delay time is accumulated in each full adder, so that parasitic capacitance existing at output node $4b'$ of gate circuit TG13 causes an increase in a delay time of a carry signal received from a next less significant bit and transmitted through gate circuit TG14.

In general, for parallel addition of multi-bit binary numbers as shown in FIG. 4, a carry signal CI is fixed to for example, "0", in a full adder F1 for the addition of the least significant bits. In the arrangement shown in FIG. 2, with a logical value of a carry signal fixed as described above, a delay time in transmitting the carry signal CI to output node $4b'$ becomes less than that in transmitting input logic signal A to output node $4b'$.

In FIG. 2, when a logical value of logic signal C is fixed, a potential level from the node $1c$ as far to the input portion of gate circuit TG14 is fixed. On the other hand, logic signal A has a logical value varying according to an input augend. Time required for propagation of this logic signal A to output node $4b'$ becomes longer than time required for propagation of this logic signal C to output node $4b'$ by a time required for propagation of this logic signal A from input node $1a$ to gate circuit TG13.

In a case in which gate circuit TG13 is turned on to transmit logic signal AB, applied from inverter circuit 14, to output node $4b'$, parasitic capacitance existing at the output portion of the off state gate circuit TG14 causes delay in propagation of logic signal AB. In this case, when input logic signal A is transmitted as a carry signal to a full adder in a subsequent stage, the propagation time is increased to prevent high-speed transmission of the carry signal.

In addition, the N bit binary addition circuit having a carry look ahead function has the arrangement shown in FIGS. 5 and 6. In this arrangement of the N bit binary addition circuit, a path on which a carry signal from a preceding stage is repeatedly selected by a carry look ahead circuit to become a carry signal for a subsequent stage requires the greatest propagation time for propagating a carry signal. The carry look ahead circuit comprises gate circuit TG8 for passing a carry signal from a carry look ahead circuit in a preceding stage and gate circuit TG7 for passing a carry signal (COm+n in FIG. 6) from the corresponding addition block 32.

Therefore, when the carry look ahead circuit passes a carry signal from a carry look ahead circuit in the preceding stage, parasitic capacitance existing at the output of gate circuit TG7 causes a delay in carry signal propagation.

When the carry signal propagation path includes a path for selectively transmitting a carry signal from the corresponding addition block to a carry look ahead circuit in a subsequent stage, that is, when a carry signal output from an intermediate block is transmitted through a chain of carry look ahead circuits, the higher the order of a stage is at which the chain starts, the shorter a time period becomes which is required for propagation of the carry signal through the chain.

As long as a time required for propagation of a carry signal through a chain of carry look ahead circuits is equal to or less than a propagation time (the longest propagation time) required for the carry signal to pass through all the carry look ahead circuits, performance in speed of the full addition circuit is not deteriorated. Therefore, higher order stage can use a longer time to pass through gate circuit TG7 in a carry look ahead circuit. Every carry look ahead circuit includes transistors of the same size for the gate circuit TG7, and parasitic capacitance of the same value is produced at the output portion of each gate circuit TG7 in each respective carry look ahead circuit. When gate circuit TG8 selects and transmits a carry signal from a carry look ahead circuit in a preceding stage, delay time caused by the parasitic capacitance at the output of the gate circuit TG7 is accumulated. Such parasitic capacitance therefore accumulatively increases the time which is required for propagation of a carry signal through carry look ahead circuits.

Now a case is considered that a logical value of a carry signal applied to a full adder of the least significant bit is fixed or predetermined as shown in FIG. 7. The following case allows a path to make propagation time of a carry signal generated from a preceding stage the longest. That is, it is the case where addition of first and second input signals A1 and B1 generates a carry in full adder 51-1 of the least significant bit in the first stage and in all of more significant bits other than the least significant bit, a carry signal from a full adder of a next lower significant bit determines an output state of a carry signal. In other words, it is the case where a carry signal from carry look ahead circuit 41 in the first stage is provided by a carry signal COm from full adder 51-n of the most significant bit in the corresponding addition block 31 in the first stage.

In the N bit binary addition circuit, propagation time becomes the longest when a carry signal sequentially passes through carry look ahead circuits in the respective stages, starting from a carry look ahead circuit in the first stage. High-speed propagation of this carry signal enables high-speed operation of the N bit binary addition circuit.

However, load capacitance existing at the output of gate circuit TG8 prevents gate circuit TG7 from transmitting carry signal COm from the most significant bit to a carry look ahead circuit in a subsequent stage at a high speed, resulting in an increase in a propagation time of a carry signal.

SUMMARY OF THE INVENTION

An object of the present invention is to provide a semiconductor integrated circuit device operable at a high speed.

Another object of the present invention is to provide a semiconductor integrated circuit device capable of selectively transmitting signals at a high speed.

A further object of the present invention is to provide a semiconductor integrated circuit device capable of performing an operation at a high speed.

Further another object of the present invention is to provide a semiconductor integrated circuit device with a selection function capable of transmitting signals at a high speed.

Still further object of the present invention is to provide a semiconductor integrated circuit device including a full addition circuit capable of transmitting carry signals at a high speed.

Still further another object of the present invention is to provide a semiconductor integrated circuit device capable of transmitting a second logic signal at a high speed in selectively passing either a first logic signal having a fixed logical value or the second logic signal having a variable logical value.

Another further object of the present invention is to provide a semiconductor integrated circuit device with a full addition function capable of transmitting an input logic signal as a carry signal to a circuit in a subsequent stage at a high speed.

Still another object of the present invention is to provide a semiconductor integrated circuit device including a carry look ahead circuit and a full addition function and capable of transmitting a carry signal from a preceding stage to a subsequent stage at a high speed.

Still further object of the present invention is to provide a semiconductor integrated circuit device including a carry look ahead function and a multi-bit full addition circuit, capable of generating a carry signal in a first stage at a high speed.

The semiconductor integrated circuit device according to the present invention includes a selection gate for selectively passing either a first logic signal or a second logic signal. The selection gate includes a first gate for passing the first logic signal to an output node and a second gate for passing the second logic signal to the output node.

When the first logic signal is to be transmitted at a high speed, load capacitance (output load impedance) viewed from the output node of the second gate is made smaller than that of the first gate.

When the second logic signal is not required to be transmitted at a high speed in particular, load capacitance viewed from the output node of the second gate is made smaller than that of the first gate.

The first gate and the second gate are coupled in common to the above-described output node.

According to the above-described arrangement, when the second gate is turned off, the output load impedance is small, so that the first gate transmits the first logic signal to the output node at a high speed.

That is, according to the present invention, load capacitance viewed from an output node of a gate receiving a signal which is not required to be transmitted at a high speed is made smaller than that of a gate receiving a signal to be transmitted at a high speed, thereby transmitting the signal to be transmitted at a high speed to the output node at a high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram for explaining operation of the circuit of FIG. 2.

FIG. 12 is a diagram for explaining operation of the full addition circuit shown in FIG. 11.

FIG. 23 is a table showing a distribution of gate width of transistors in gate circuits receiving a carry signal from each related addition block in carry look ahead circuits in the N bit full addition circuit.

FIG. 24 is a diagram showing another embodiment of the distribution of gate width shown in FIG. 23.

DESCRIPTION OF THE PREFERRED EMBODIMENTS

Figure 1:
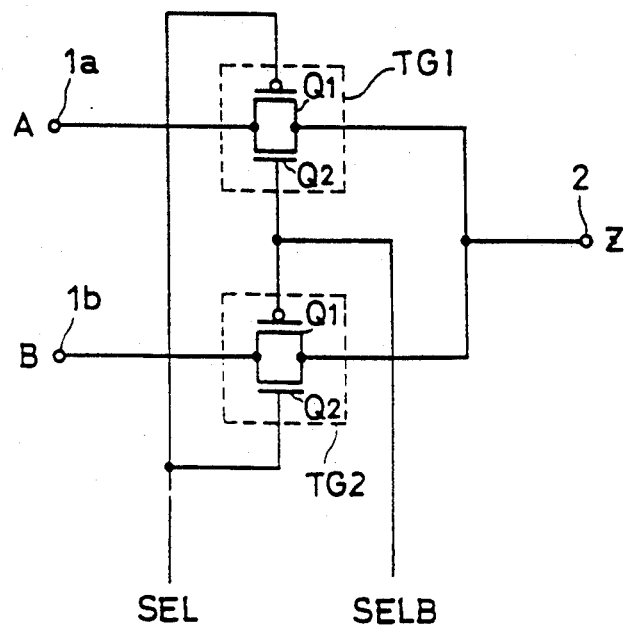
FIG. 1 is a diagram showing a construction of a conventional two-input signal selection circuit.
Figure 9:
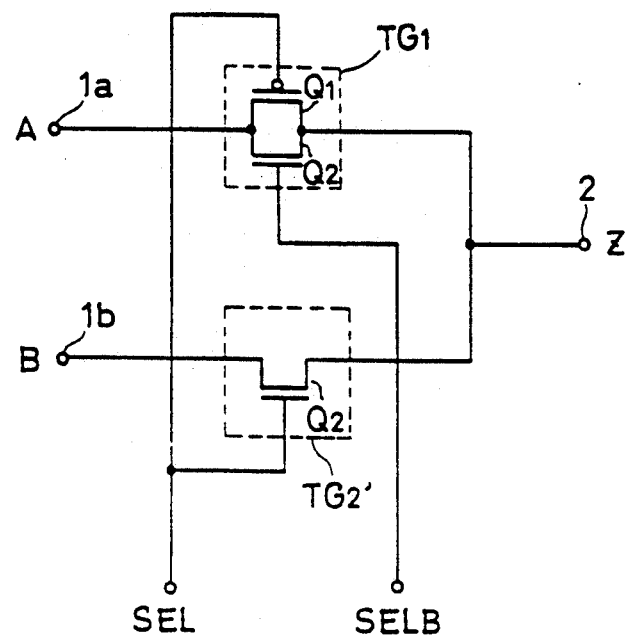
FIG. 9 is a diagram showing one embodiment of a two-input signal selection circuit according to the present invention.

FIG. 9 is a diagram showing a construction of a semiconductor integrated circuit device according to one aspect of the present invention, which provides an improvement to the selection circuit shown in FIG. 1.

In FIG. 9, the selection circuit comprises a gate circuit TG1 for passing a logic signal A applied to an input node 1a in response to control signals SEL and SELB and a gate circuit TG2' for passing a logic signal B applied to an input node 1b in response to control signal SEL. Output logic signals of gate circuits TG1 and TG2' are transmitted to an output node 2.

Gate circuit TG1 includes a CMOS transmission gate and is constituted by a parallel connection of a p channel MOS transistor Q1 and an n channel MOS transistor Q2. Control signal SEL is applied to the gate of p channel MOS transistor Q1 and complementary control signal SELB is applied to the gate of n channel MOS transistor Q2.

Gate circuit TG2' comprising a MOS transfer gate includes an n channel MOS transistor Q2 having a gate receiving control signal SEL. Operation of the selection circuit will be described in the following.

When control signal SEL goes to "0", complementary control signal SELB goes to "1". In this case, gate circuit TG1 is turned on, while gate circuit TG2' is turned off. A logic signal applied to input node 1a is accordingly transmitted to output node 2 to become an output logic signal Z.

When control signal SEL is at "1" and complementary control signal SELB is at "0", gate circuit TG1 is turned off and gate circuit TG2' is turned on. Logic signal B applied to input node 1b is accordingly transmitted to output node 2 to become an output logic signal Z.

In the selection circuit structure as shown in FIG. 9, gate circuit TG2' includes only one MOS transistor and therefore parasitic capacitance existing at the output portion thereof is smaller than that of gate circuit TG1. Therefore, output load capacitance (impedance) of gate circuit TG1 becomes smaller than that of gate circuit TG2, to allow input logic signal A to be transmitted to output node 2 at a high speed.

Figure 10:
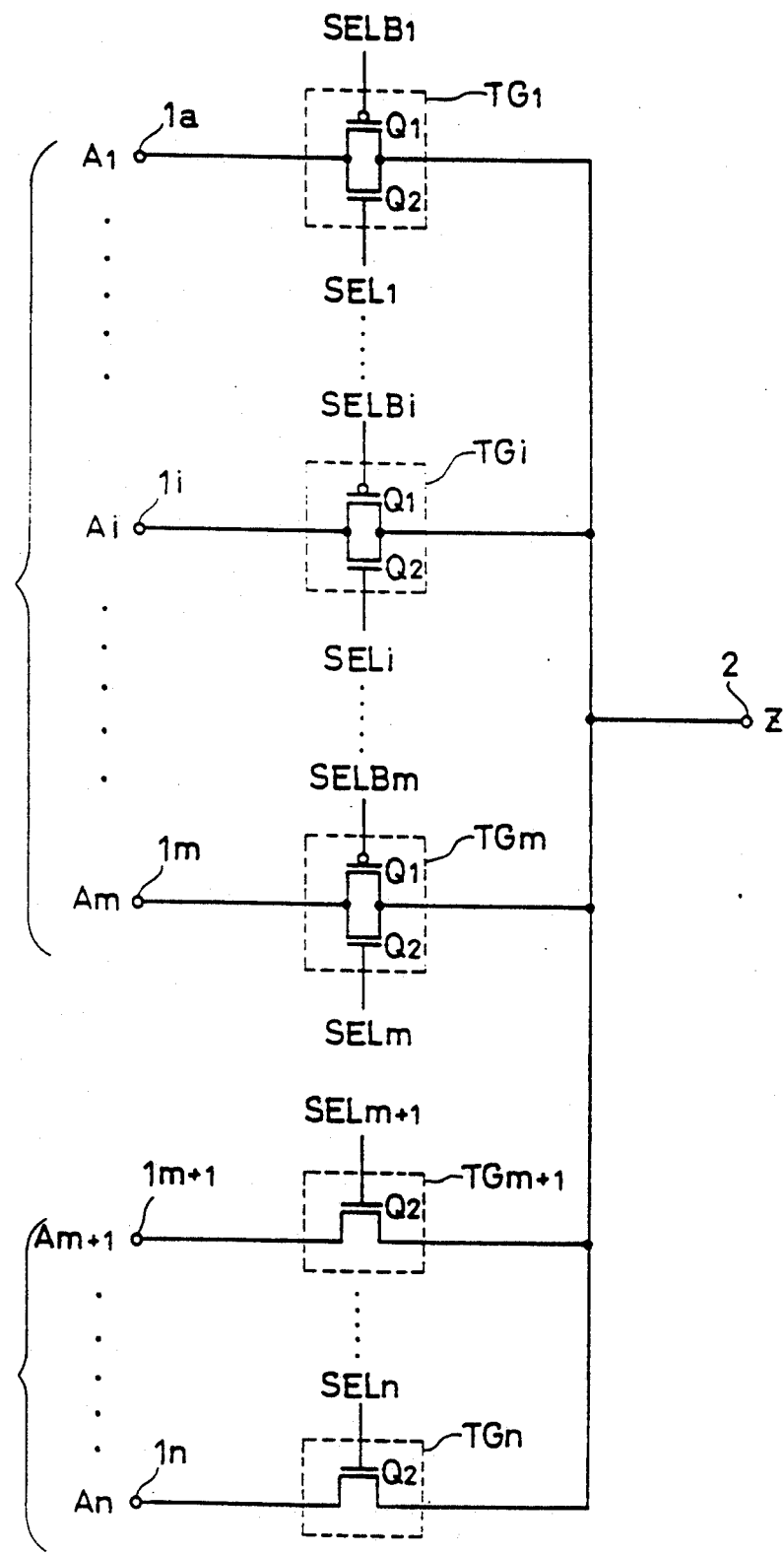
FIG. 10 is a diagram showing an arrangement of a signal selection circuit according to another embodiment of the present invention.

FIG. 10 is a diagram showing another structure of a semiconductor integrated circuit according to the present invention. In the circuit shown in FIG. 10, input logic signals are divided into two groups of input logic signals A1-Am and input logic signals Am+1-An. The selection circuit shown in FIG. 10 comprises a plurality of gate circuits TG1-TGm and TGm+1-TGn provided in parallel to an output node 2. Each of gate circuits TG1-TGm includes a parallel connection of a p channel MOS transistor Q1 and an n channel MOS transistor Q2. A gate circuit TGk (K=1-m) receives a complementary control signal SELBk at the gate of its p channel MOS transistor Q1 and a control signal SELk at the gate of its n channel MOS transistor Q2. Gate circuits TG1-TGm transmit logic signals A1-Am applied to input nodes 1a-1m to output node 2 in response to control signals SEL1-SELm, respectively.

Each of gate circuits TGm+1-TGn includes one n channel MOS transistor Q2. N channel MOS transistors Q2 of these circuits TGm+1-TGn are turned on in response to the corresponding control signals SELm+1-SELn. Gate circuits TGm+1-TGn transit input logic signals Am+1-An applied to input nodes 1m+1-1n to output node 2 in response to control signals SELm+1-SELn, respectively.

Operation will be briefly described, in the following.

When control signal SELk is at "1" and the remaining control signals SEL1-SELk−1 and control signals SELk+1-SELn are at "0", only the gate circuit TGk is turned on. In this case, a logic signal Ak applied to an input node 1k is transmitted to output node 2.

In the selection circuit arranged as shown in FIG. 10, one logic signal Ak is selected among n logic signals A1-Am in response to control signal SELk. Also in the selection circuit of FIG. 10, parasitic capacitance at the output portion of each of gate circuits TGm+1-TGn is smaller than that of each of gate circuits TG1-TGm. Logic signals A1-Am are therefore transmitted faster than logic signals Am+1-An.

As shown in FIG. 10, logic signals are grouped into two groups of (a) logic signals to be transmitted at a high speed and (b) logic signals having fixed logical values or which are not required to be transmitted so fast and for the former group (a) gate circuits each comprise a parallel connection of a p channel MOS transistor and an n channel MOS transistor and for the latter group (b) gate circuits each comprise one MOS transistor. Thus, high-speed transmission of the logic signals to be transmitted at a high speed to output node 2 is implemented.

Figure 2:
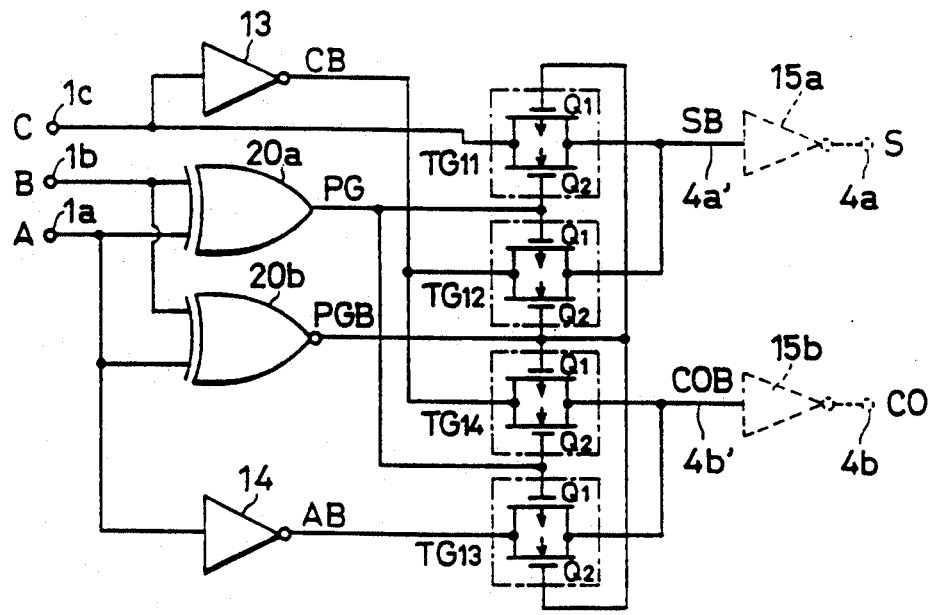
FIG. 2 is a diagram showing a construction of a conventional binary full addition circuit.
Figure 4:
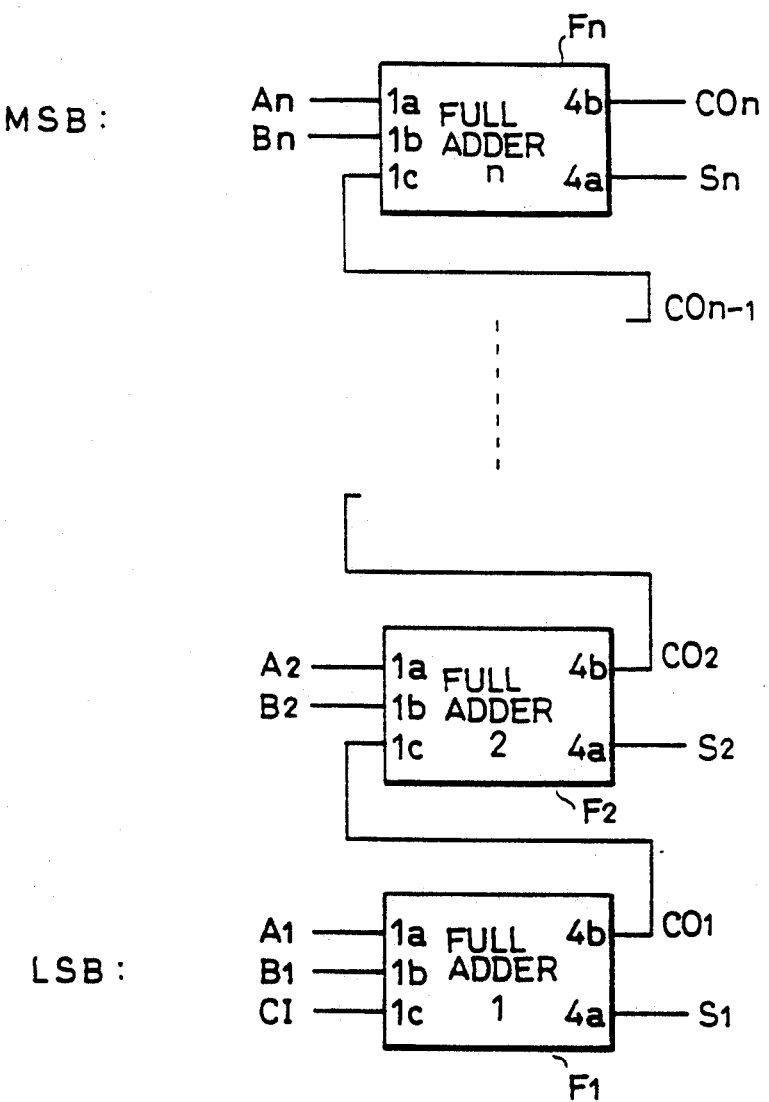
FIG. 4 is a diagram showing a construction of an n bit parallel addition circuit using the full addition circuit shown in FIG. 2.
Figure 11:
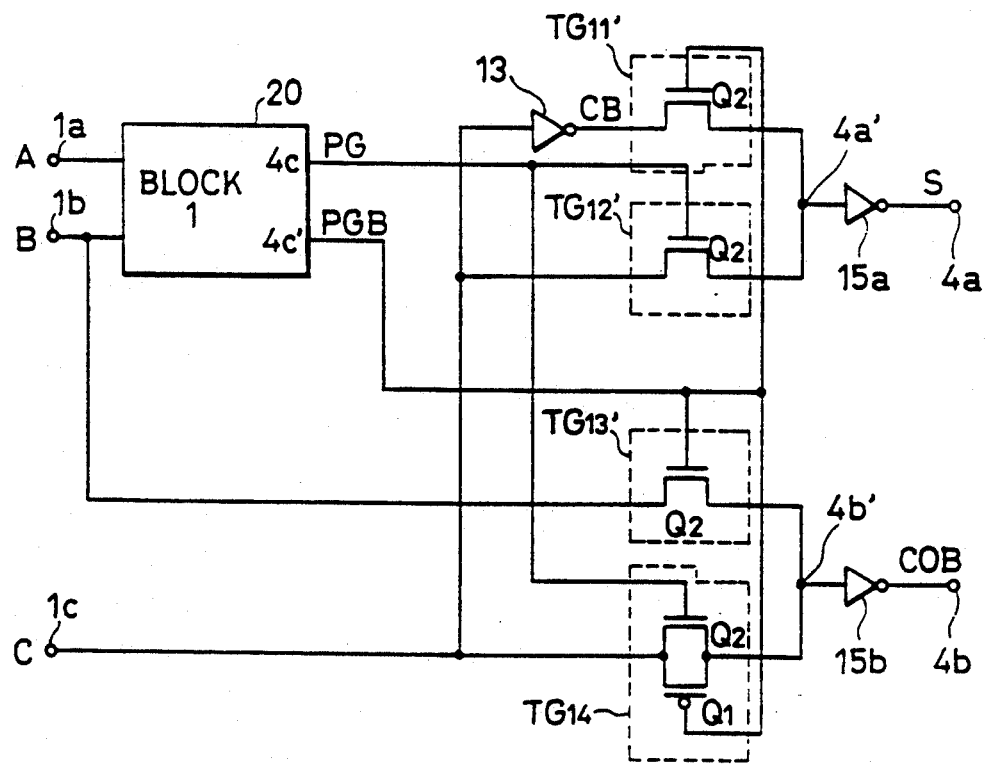
FIG. 11 is a diagram showing a first embodiment of a binary full addition circuit according to the present invention.

FIG. 11 is a diagram showing a further embodiment of a semiconductor integrated circuit according to the present invention, which is an improvement of the conventional semiconductor integrated circuit shown in FIG. 2. In FIG. 11, the same reference numerals are allotted to the corresponding portions in the arrangement of FIG. 3. In FIG. 11, a block 20 comprises the exclusive OR circuit and the exclusive NOR circuit shown in FIG. 2. A control signal PG is generated from an output node 4c and a control signal PGB is generated from an output node 4c' of block 20. Control signal PG is obtained by an exclusive OR operation of logic signals A and B. Control signal PGB is obtained by exclusive NOR operation of logic signals A and B.

The addition circuit further includes gate circuits TG11', TG12', TG13' and TG14. Gate circuit TG11' includes one n channel MOS transistor Q2. Gate circuit TG11' receives a logic signal C applied to an input node 1c through an inverter circuit 13 and transmits an output signal CB of inverter circuit 13 to an output node 4' in response to control signal PGB.

Gate circuit TG12' includes one n channel MOS transistor Q2. Gate circuit TG12' transmits logic signal C applied to input node 1c to output node 4a' in response to control signal PG. The signal transmitted to output node 4b' is transmitted to an output node 4a through an inverter circuit 15a. A logic signal S at output node 4a indicates a bit value of the first order digit of the addition result (A+B+C) of logic signals A, B and C.

Gate circuit TG13' includes one n channel MOS transistor. Gate circuit TG13' transmits a logic signal B applied to an input node 1b to an output node 4b' in response to control signal PGB.

Gate circuit TG14 comprises a parallel connection of an n channel MOS transistor Q2 and a p channel MOS transistor Q1. n channel MOS transistor Q2 receives control signal PG at its gate. p channel MOS transistor Q1 receives control signal PGB at its gate. Gate circuit TG14 transmits logic signal C applied to input node 1c to output node 4b' in response to control signals PGB and PG.

The logic signal transmitted to output node 4b' is transmitted to an output node 4b through an inverter circuit 15b. The logic signal COB transmitted to output node 4b indicates an inverted value of a bit value of the second order digit of the addition result (A+B+C). The following is a reason why inverter circuits 15a and 15b are provided. In general, a gate circuit comprising a p channel MOS transistor and an n channel MOS transistor has properties that it can transmits signals without causing signal loss. On the other hand, a gate circuit comprising one MOS transistor causes transmission signal loss depending on a threshold voltage of the transistor. Inverter circuits 15a and 15b are provided for compensating for the transmission loss of the signal, FIG. 12 is table showing operation of the addition circuit shown in FIG. 11. The operation will be briefly described in the following.

The addition circuit shown in FIG. 11 adds logic signals A and B and a carry signal C. A logic signal S indicative of the first order digit of the result of addition of logic signals A and B and carry signal C, that is, indicative of a sum of the addition is obtained at output node 4a. An inversion signal COB of the carry signal generated as a result of the addition of logic signals A, B and C is obtained at output node 4b. When logic signals A and B have the same logical value, control signal PG goes to "0" and control signal PGB goes to "1". As a result, gate circuit TG11' and gate circuit TG13' are turned on. Then, the carry signal C applied to input node 1c is transmitted to output node 4a' through inverter circuit 13. The logic signal B applied to input node 1b is transmitted to output node 4b'. In this case, the logical value of the first order digit of the result of addition of logic signals A and B is "0". The first order digit of the result of addition of logic signals A, B and C accordingly corresponds to the logical value of the carry signal C.

The value of logic signal B determines as to whether this addition (A+B+C) generates a carry or not. In other words, when logic signal B is at "0", the carry signal goes to "0" and when logic signal B is at "1", the carry signal goes to "1".

When logic signals A and B have different logical values, control signal PG goes to "1" and control signal PGB goes to "0". In this case, gate circuits TG12' and TG14 are turned on. In this state, carry signal C transmitted to input node 1c is transmitted to output node 4a'. In addition, carry signal C applied to input node 1c is transmitted to output node 4b'. When logic signals A and B have different logical values, the addition result on these signals is "1". Therefore, the logical value at the first order digit of the addition result (A+B+C) is determined by carry signal C. Carry signal C also determines as to whether a carry signal is generated (goes to "1") by this addition or not.

In the addition circuit as structured shown in FIG. 11, with small load capacitance viewed from output node 4b' of gate circuit TG13', carry signal C applied to input node 1c is transmitted to output node 4b' at a high speed. Therefore, thus structured addition circuit enables high-speed propagation of carry signal.

The same logic can be obtained by replacing logic signals A and B with each other in the addition circuit structured as shown in FIG. 11.

Figure 13:
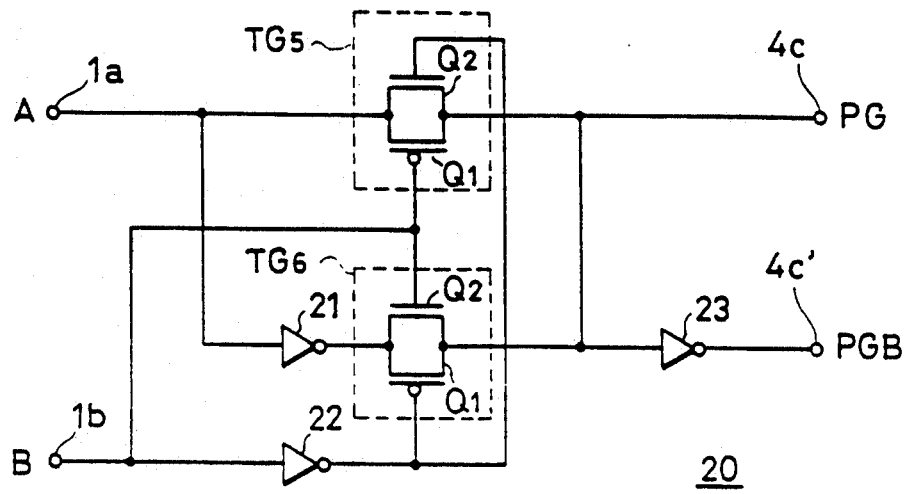
FIG. 13 is a diagram showing one example of a specific construction of a control signal generation block shown in FIG. 11.

FIG. 13 is a diagram showing a specific arrangement of block 20 shown in FIG. 11. Block 20 shown in FIG. 13 uses gate circuits for implementing exclusive OR circuit 20a and exclusive NOR circuit 20b in the conventional addition circuit shown in FIG. 2. In FIG. 13, block 20 comprises gate circuits TG5 and TG6. Each of gate circuits TG5 and TG6 includes a parallel connection of an n channel MOS transistor Q2 and a p channel MOS transistor Q1. Gate circuits TG5 and TG6 are turned on/off in response to a logic signal B applied to input node 1b. Gate circuit TG5 receives logic signal B at the gate of p channel MOS transistor Q1 and logic signal B at the gate of n channel MOS transistor Q2 through an inverter circuit 22.

Gate circuit TG6 receives logic signal B at the gate of p channel MOS transistor Q1 through inverter circuit 22 and logic signal B at the gate of n channel MOS transistor Q2. Gate circuit TG5 passes a logic signal A applied to an input node 1a. Gate circuit TG6 passes the logic signal applied to input node 1a through an inverter circuit 21.

A logic signal from either of gate circuits TG5 and TG6 is transmitted to an output node 4c to become a control signal PG. A logic signal from either of gate circuits TG5 and TG6 is transmitted to output node 4c' through an inverter circuit 23 to become a control signal PGB. Operation will be described in the following.

(1) In a case in which logic signal A is at "1" and logic signal B is at "1": in this case, gate circuit TG6 is turned on to transmit a logic "0" signal received through inverter 21. Control signal PG goes to "0" and control signal PGB goes to "1", accordingly.

(2) In a case in which logic signal A is at "0" and logic signal B is at "0": in this case, gate circuit TG5 is turned on to pass logic "0" signal A. Control signal PG goes to "0" and control signal PGB goes to "1", accordingly.

(3) In a case in which logic signal A is at "1" and logic signal B is at "0": in this case, gate circuit TG5 is turned on to pass a logic "1" signal. Control signal PG goes to "1" and control signal PGB goes to "0", accordingly.

(4) In a case in which logic signal A is at "0" and logic signal B is at "1": in this case, gate circuit TG6 is turned on to pass a logic "1" signal. Control signal PG goes to "1" and control signal PGB goes to "0", accordingly.

As is clear from the foregoing, when logic signals A and B have the same logical value, control signal PGB goes to "1" and control signal PG to "0". When logic signals A and B have different logical values, control signal PG goes to "1" and control signal PGB goes to "0".

In the arrangement shown in FIG. 13, transmission of logic signal A and a negation signal thereof is controlled in response to logic signal B and a negation signal thereof. In this case, the same logic can be obtained even by replacing logic signals A and B with each other. In addition, while each of gate circuits TG5 and TG6 is constituted by a parallel connection of n channel MOS transistor Q2 and p channel MOS transistor Q1, it may be constituted by one n channel MOS transistor or one p channel MOS transistor.

Figure 14:
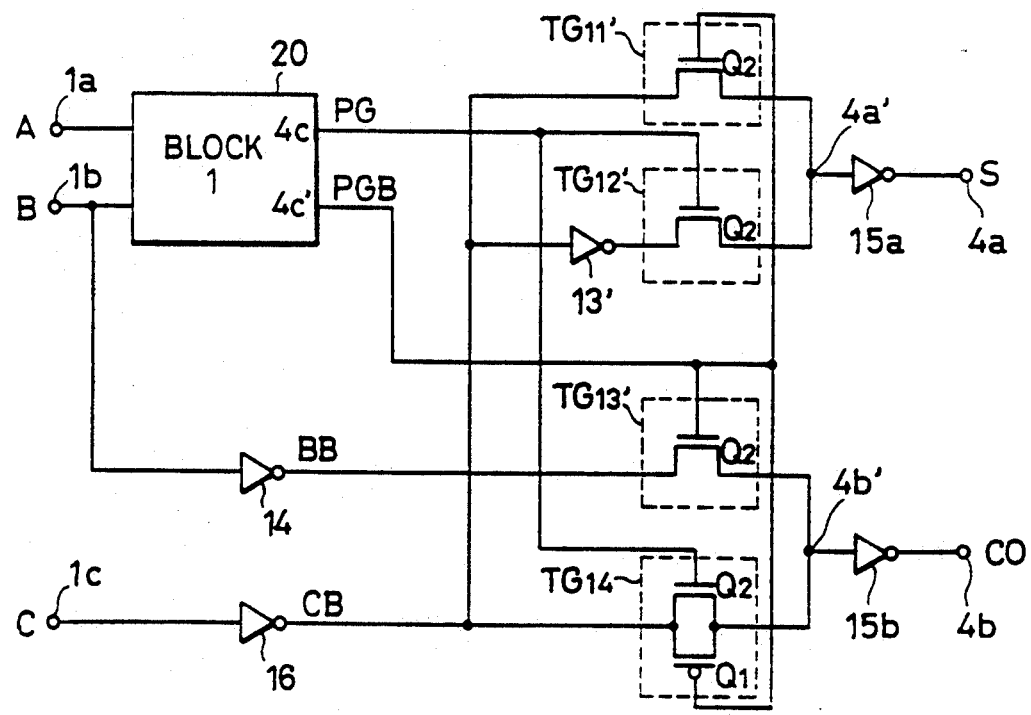
FIG. 14 is a diagram showing a second embodiment of a binary full addition circuit according to the present invention.

FIG. 14 is a diagram showing another construction of a semiconductor integrated circuit according to the present invention, which is a modified example of the addition circuit shown in FIG. 11. In FIG. 14, the same reference numerals are allotted to the portions corresponding to those shown in FIG. 11, description of which is omitted. In the addition circuit structured as shown in FIG. 14, a gate circuit TG11' receives a logic signal C through an inverter circuit 16. A gate circuit TG12' receives logic signal C through inverter circuit 16 and an inverter circuit 13'. A gate circuit TG13' receives a logic signal B through an inverter circuit 14. A gate circuit TG14 receives logic signal C through inverter circuit 16. In the construction shown in FIG. 14, logic of a logic signal S applied to an output node 4a is the same as in FIG. 11. However, logic of a logic signal transmitted to an output node 4b is opposite to that shown in FIG. 11. In the construction shown in FIG. 14, therefore, a logic signal CO transmitted to output node 4b indicates a logical value of a logic signal, that is, a carry signal, of the second order digit of the addition result (A+B+C).

Figures 15, 16:
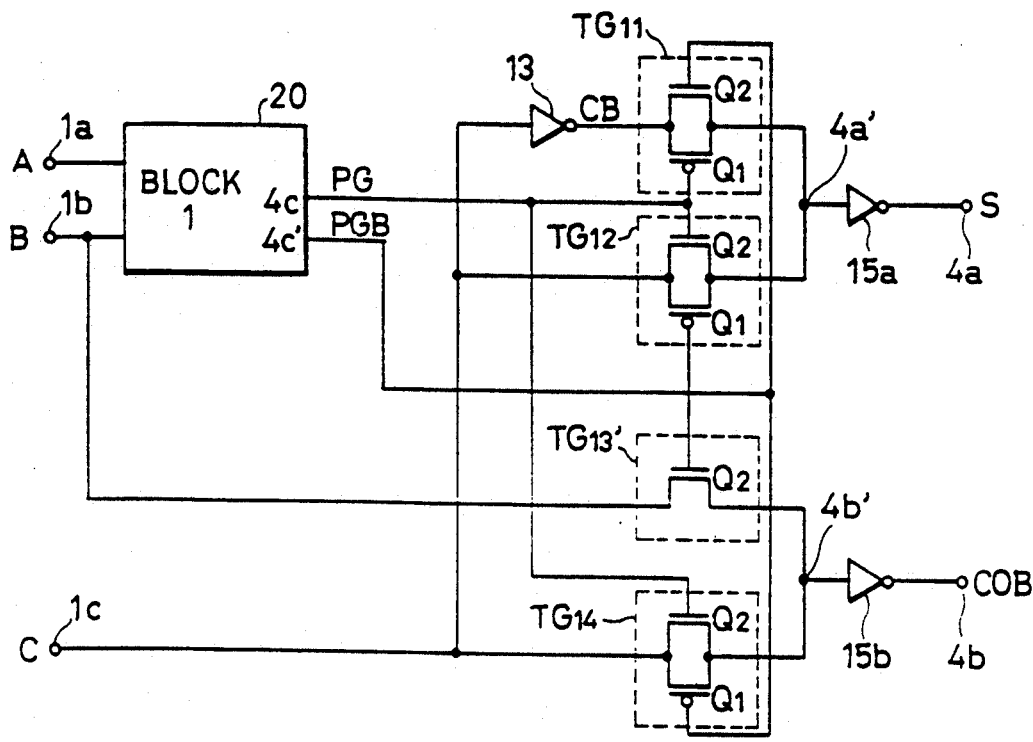
FIG. 15 is a diagram showing a third embodiment of a binary full addition circuit according to the present invention.
FIG. 16 is a diagram showing a modified example of the binary full addition circuits shown in FIGS. 14 and 15.

FIG. 15 is a diagram showing a further embodiment of a semiconductor integrated circuit according to the present invention. In the addition circuit shown in FIG. 15, the same reference numerals are allotted to the portions corresponding to those in the addition circuit shown in FIG. 11. In the circuit arrangement shown in FIG. 15, only a gate circuit TG13' comprises a single n channel MOS transistor Q2 and the other gate circuits TG11, TG12 and TG14 each comprise a parallel connection of an n channel MOS transistor Q2 and a p channel MOS transistor Q1. The circuit shown in FIG. 15 is also structured such that gate circuit TG13' comprises a single n channel MOS transistor on a path through which an input carry signal C is transmitted as a carry signal COB to a subsequent stage. Therefore, gate circuit TG14 can transmit carry signal C to an output node 4b' at high speed, thereby reducing a carry signal propagation delay in a carry signal propagation chain.

Logic signal A and logic signal B can be interchanged with each other in the arrangements of the addition circuit shown in FIGS. 11, 14 and 15 to obtain the same logic operation. Conductivity type of an MOS transistor in each of gate circuits TG11–TG14 and TG11'–TG14' can be set opposite to obtain the same logic operation if control signals PG and PGB applied to these circuits are replaced with each other.

It is now assumed that a 8-bit full addition circuit is structured using the above-described semiconductor integrated circuit (full addition circuit). In this case, transistors of gate circuit TG13' have the same size, and propagation delay of a carry signal output from a next lower significant bit is accumulated. Therefore, as shown in FIG. 16, a transistor size of a gate circuit TG13' included in a full adder for a less significant bit is made larger and a transistor size of gate circuit TG13' of full adders corresponding to more significant bits is made smaller in this multi-bit full addition circuit. Herein, FIG. 16 shows an arrangement of transistor sizes of a 8-bit parallel addition circuit in which the full adders shown in FIGS. 11, 14 or 15 are used as full adders 1 to 8.

Figure 8A:
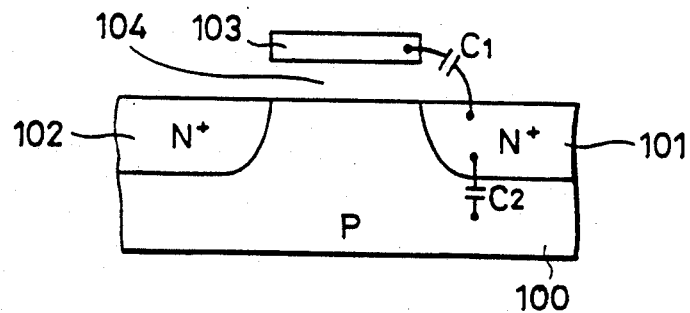
FIGS. 8A to 8C are diagrams showing a construction and a plane arrangement of an MOS transistor and an equivalent circuit, respectively.
Figure 8B:
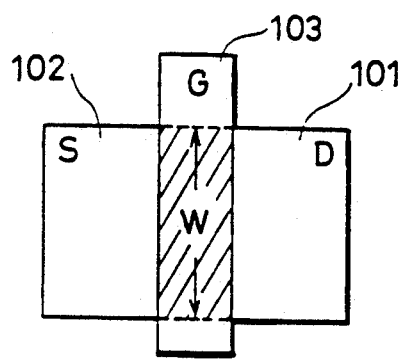
Figure 8C:
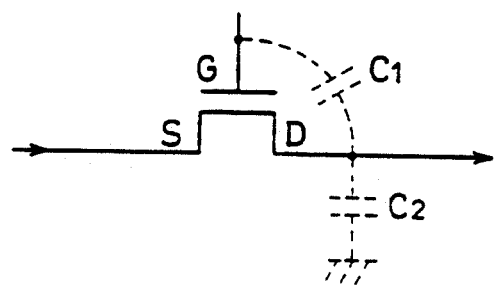

Full adder 1 is provided corresponding to the least significant bit and full adder 8 is provided corresponding to the 8th bit (the most significant bit). A gate width of an n channel MOS transistor Q2 included in a gate circuit TG13' of full adder #1 is 8 W and gate widths of n channel MOS transistors included in gate circuits TG13' of full adders of more significant bits are made smaller in order. Herein, a unit gate width W corresponds to a gate width shown in FIG. 8B. The smaller the gate width becomes, the smaller the size of the MOS transistor becomes. As a result, a parasitic capacitance value of an output portion of the MOS transistor is reduced. Gate-to-drain capacitance is determined by an area along which a gate electrode and a drain region face to each other and parasitic capacitance between the drain region and a substrate is determined by an area of the drain region. Therefore, a reduced gate width reduces a these capacitances to provide a smaller parasitic capacitance, accordingly.

Figures 17, 18:
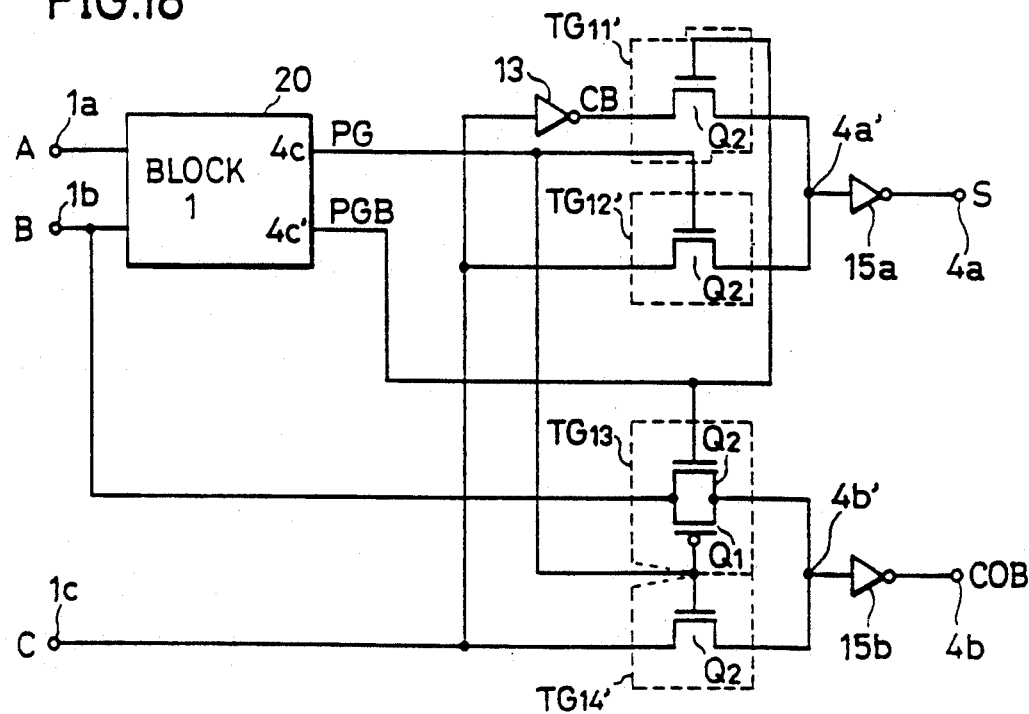
FIG. 17 is a diagram showing another modified example of the binary full addition circuit shown in FIG. 16.
FIG. 18 is a diagram showing a fourth embodiment of a binary full addition circuit according to the present invention.

FIG. 17 is a diagram showing a modified example for distribution of gate width shown in FIG. 16. In the distribution of gate width shown in FIG. 17, a gate width of a transistor Q2 of gate circuit TG13' included in each of full adders #1 to #4 provided corresponding to a first bit to a fourth bit is set to 8 W and a gate width of a transistor Q2 of gate circuit TG13' of each of full adders #5 to #8 provided corresponding to a 5th to a 8th bit is set to 4 W. As described above, the arrangement of a multi-bit parallel adder circuit wherein a gate width of transistor Q2 included in a gate circuit TG13' for each of least significant bits is set to be larger than a gate width of a transistor Q2 of a gate circuit TG13' of each of full adders for most significant bits, enables a higher bit to allow a carry signal C from a less significant bit to be transmitted at a higher speed, thereby reducing propagation delay of the carry signal from a less significant bit.

Distribution of gate width of a transistor 12 is not limited to those shown in FIGS. 16 and 17 and any distribution is possible as long as a gate width of transistor Q2 of gate circuit TG13' of each of full adders corresponding to more significant bits is smaller than a gate width of transistor Q2 of gate circuit TG13' of a full adder corresponding to a less significant bit.

FIG. 18 is a diagram showing a further arrangement of a semiconductor integrated circuit according to the present invention, which is an improvement of the conventional semiconductor integrated circuit shown in FIG. 2. In FIG. 18, the same reference numerals are allotted to the portion corresponding to those of the semiconductor integrated circuit shown in FIG. 2. In FIG. 18, a full addition circuit comprises a block 20 for generating control signals PG and PGB from logic signals A and B, gate circuits TG11' and TG12' for outputting an addition result S and gate circuits TG13 and TG14' for outputting an inversion signal COB of a carry signal.

Block 20 performs an exclusive OR operation of logic signals A and B to generate control signal PG from its output node 4c. Block 20 also performs an exclusive NOR operation of logic signals A and B to generate control signal PGB from its output node 4c'.

Gate circuit TG11' includes an n channel MOS transistor Q2 for passing an inversion signal CB of logic signal C applied from an inverter circuit 13 in response to control signal PGB.

Gate circuit TG12' includes an n channel MOS transistor Q2 for transmitting logic signal C to an output node 4a" in response to control signal PG.

Gate circuit TG13 includes an n channel MOS transistor Q for receiving control signal PGB at its gate and an p channel MOS transistor Q1 for receiving control signal PG at its gate. The transistors Q1 and Q2 are connected in parallel to each other. Gate circuit TG13 transmits logic signal B to an output node 4b' in response to control signals PG and PGB.

Gate circuit TG14' includes an n channel MOS transistor Q2 for transmitting logic signal C to output node 4b' in response to control signal PG.

Logic operation of the full addition circuit shown in FIG. 18 is the same as that of the conventional full addition circuit shown in FIG. 2. When control signal PG is at "1", gate circuits TG12' and TG14' are turned on. As a result, logic signal C is transmitted to output nodes 4a' and 4b'. That is, when logic signals A and B have different logical values, the addition result S (SB) and carry signal C (COB) are both determined by a carry signal C from a preceding stage.

When control signal PGB is at "1", gate circuits TG11' and TG13 are turned on. As a result, logic signal C is transmitted to output node 4a' through inverter circuit 13. Logic signal B is transmitted to output node 4b'. That is, when logic signals A and B have the same logical value, the addition result is determined by a carry signal C and generation of carry as a result of the addition (A+B+C) is determined by logic signal B.

When a logical value of a carry signal C from a preceding stage is predetermined or fixed in the circuit arrangement shown in FIG. 18, logic signal B should be transmitted to output node 4b' at a speed higher than that for a carry signal C. Therefore, gate circuit TG14' is structured to have a single MOS transistor in order to reduce output load of gate circuit TG13. With gate circuits TG11' and TG12' each being constituted by a single MOS transistor, dimensions of the full adder can be reduced. In addition, gate circuits TG11' and TG12' each comprising a single MOS transistor enable a signal to be transmitted to output node 4a' at high speed with reduced output load thereof.

Figure 19:
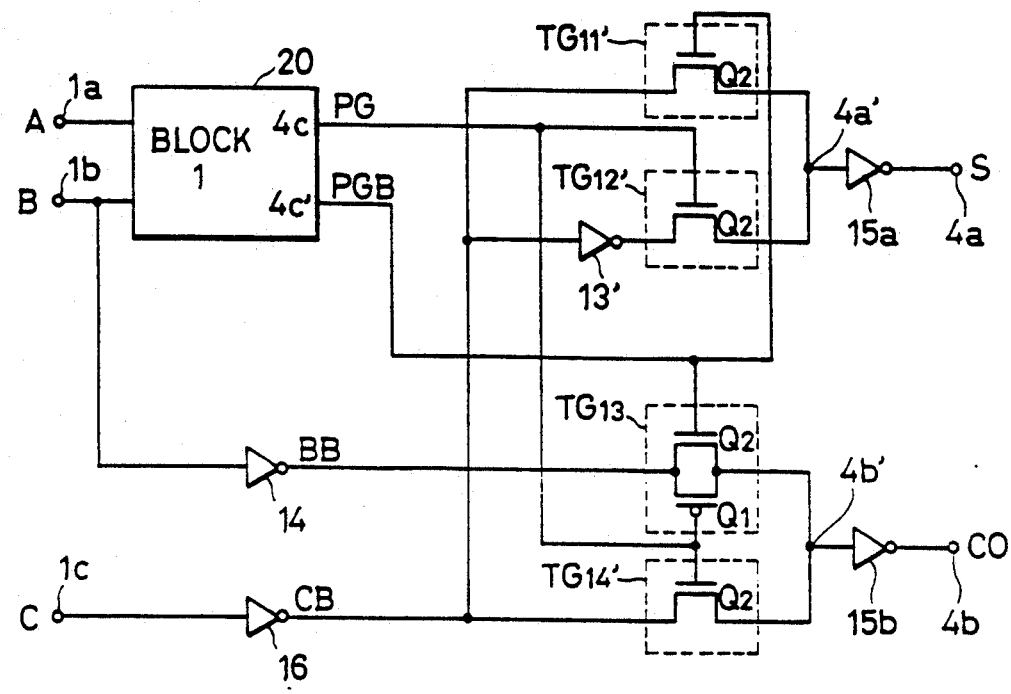
FIG. 19 is a diagram showing a fifth embodiment of a binary full addition circuit according to the present invention.

FIG. 19 is a diagram showing a modified example of the semiconductor integrated circuit shown in FIG. 18. In FIG. 19, the same reference numerals are allotted to the portions corresponding to those of the semiconductor integrated circuit shown in FIG. 18. The arrangement shown in FIG. 19 is identical to that of the circuit shown in FIG. 18 excluding that a logic signal B is transmitted to gate circuit TG13 through an inverter circuit 14, an inversion signal CB of a logic signal C is transmitted to gate circuit TG14' through an inverter circuit 16 and logic signal C is transmitted to gate circuit TG12' through inverter circuits 16 and 13'.

In the arrangement shown in FIG. 19, a logic signal transmitted to an output node 4b has its logical value inverted from that in the arrangement shown in FIG.

18. Logic of a logic signal transmitted to an output node 4a' is the same in FIGS. 18 and 19.

Figure 20:
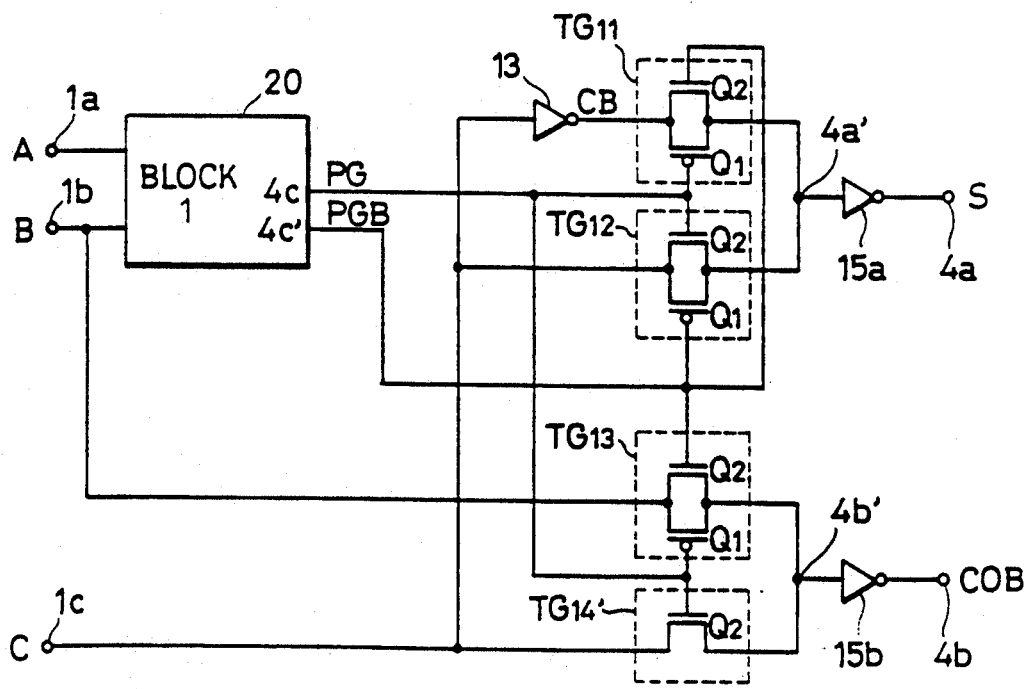
FIG. 20 is a diagram showing a sixth embodiment of a binary full addition circuit according to the present invention.

FIG. 20 is a diagram showing still further modified example of the semiconductor integrated circuit shown in FIG. 18. The circuit arrangement shown in FIG. 20 is identical to that of FIG. 18 except that each of gate circuits TG11 and TG12 comprises a parallel connection of an n channel MOS transistor Q2 and a p channel MOS transistor Q1. The remaining parts of the arrangement are identical to that of FIG. 18. Also in the circuit arrangement shown in FIG. 20, logic signal B is propagated to output node 4b' at a high speed.

Logic signals A and B in each of full addition circuits shown in FIGS. 18, 19 and 20 can be replaced with each other to obtain the same logic operation. Conductivity type of a MOS transistor of each of gate circuits TG11-TG14 and TG11'-TG14' can be set to be opposite to achieve the same logic operation as long as a control signals applied thereto are replaced with each other.

Figure 6:
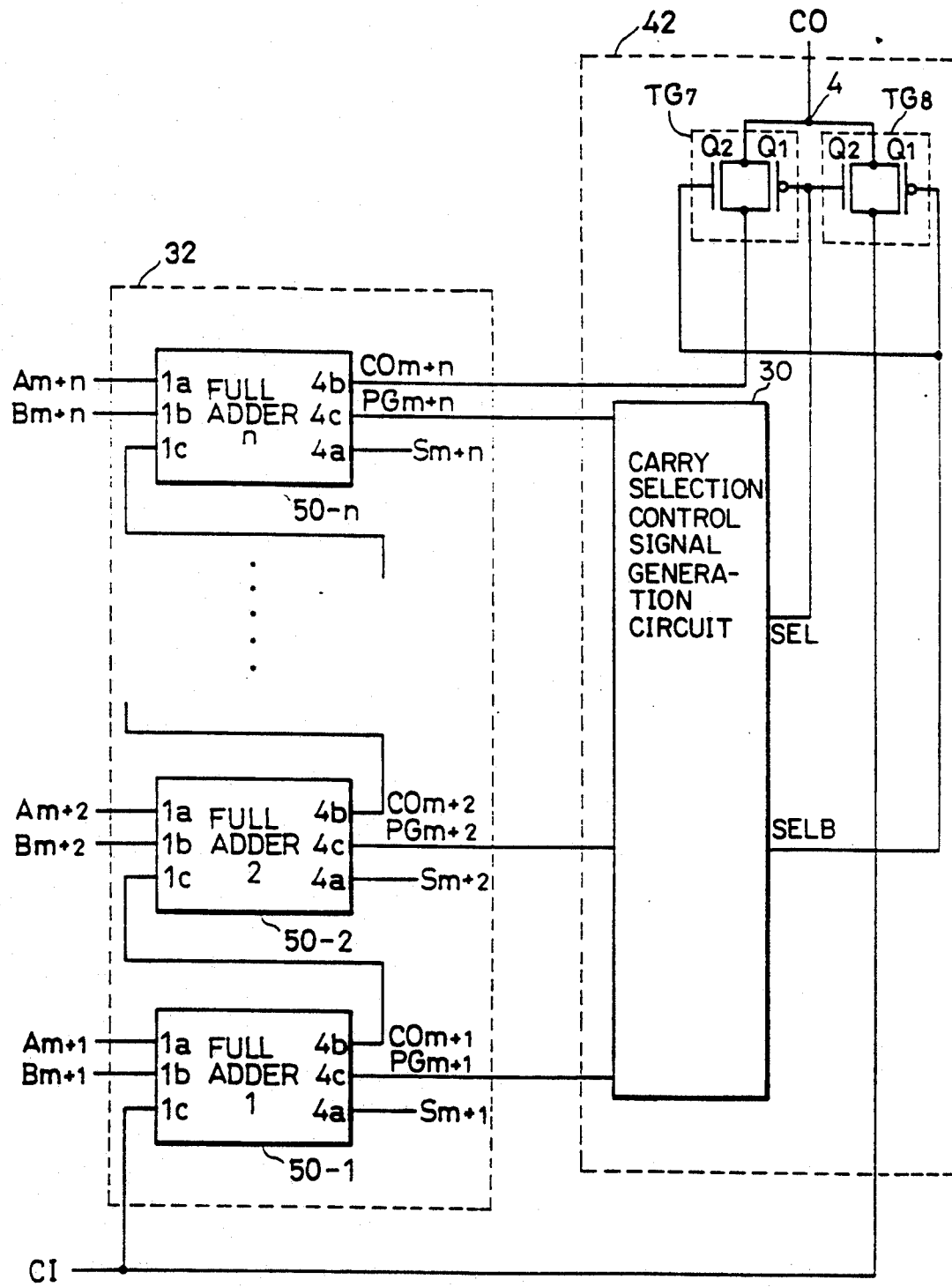
FIG. 6 is a diagram specifically showing a construction of a stage of the N bit full addition circuit shown in FIG. 5.
Figure 21:
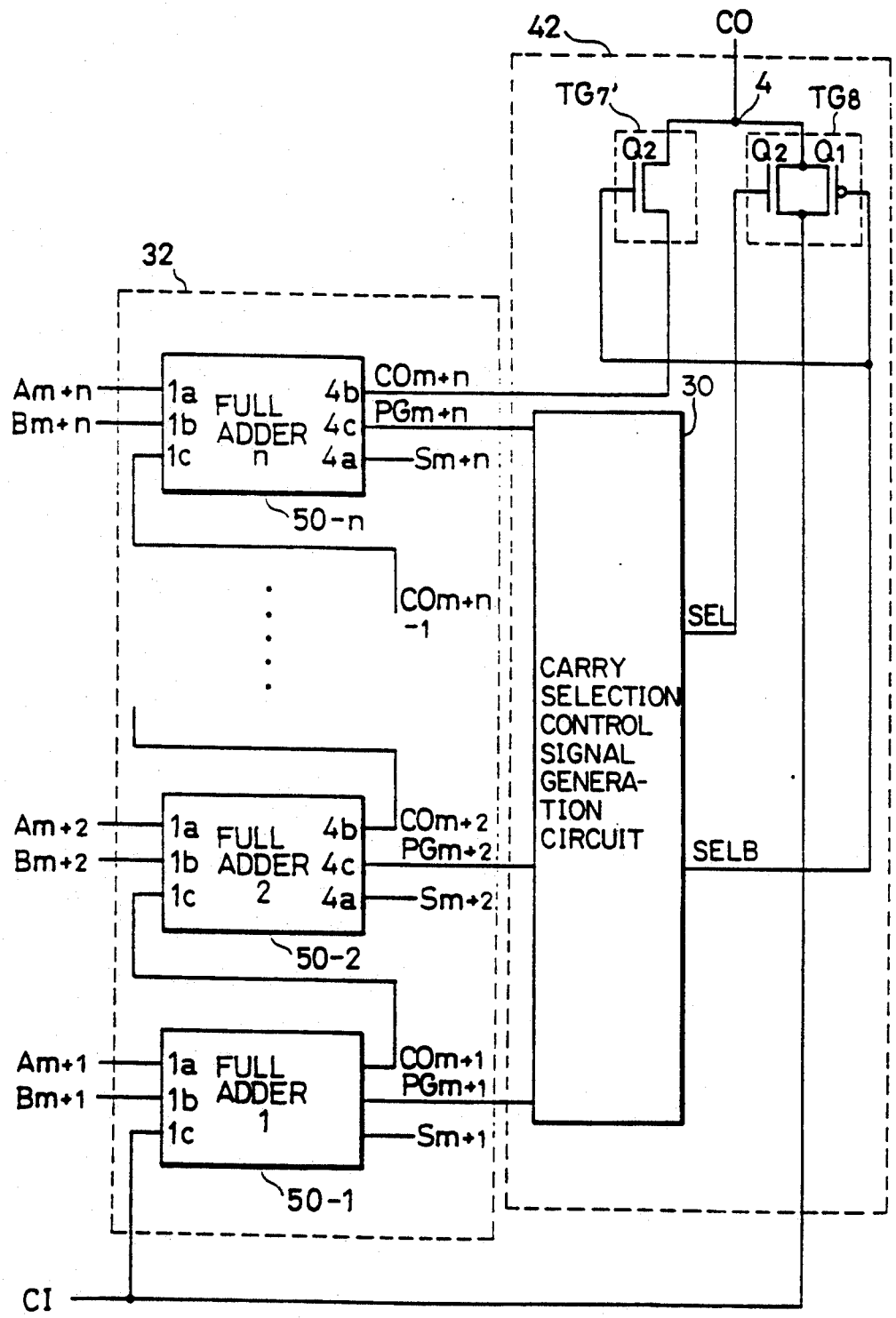
FIG. 21 is a diagram showing an embodiment of an N bit full addition circuit having a carry look ahead function according to the present invention.

FIG. 21 is a diagram showing still further arrangement of a semiconductor integrated circuit according to the present invention, which provides an improvement to the parallel addition circuit shown in FIG. 6. The semiconductor integrated circuit shown in FIG. 21 includes a one-stage addition block 32 in a full addition circuit having a carry look ahead function. In the arrangement of the semiconductor integrated circuit shown in FIG. 21, the same reference numerals are allotted to the portions corresponding to those of the conventional semiconductor integrated circuit shown in FIG. 6. The semiconductor integrated circuit shown in FIG. 21 is identical to that of the semiconductor integrated circuit shown in FIG. 6 excluding that a carry look ahead circuit 42 includes a gate circuit TG7, comprising a single n channel MOS transistor. The gate circuit TG7' functions to pass a carry signal COm+n from a full adder 50-n of the most significant bit in the corresponding addition block 32.

Gate circuit TG7' is turned on in response to a control signal SELB. A carry signal CI transmitted from a block for a next lower significant bit is applied to a gate circuit TG8. Gate circuit TG8 includes an n channel MOS transistor Q2 and a p channel MOS transistor Q1 connected in parallel to each other. The gate of n channel MOS transistor Q2 receives a control signal SEL and the gate of p channel MOS transistor Q1 receives a control signal SELB. Operation will be briefly described in the following.

A case is considered where logical values of input logic signals Am+j and Bm+j (j=1-n) are different from each other in all of full adders 50-1 to 50-n. In this case, carry signal CI applied from a carry look ahead circuit in a preceding stage is applied to full adder 50-1. A logical value of a carry output is first determined in full adder 50-1. The carry signal of the full adder 50-1 is sequentially propagated to full adders of more significant bits. Finally, full adder 50-n of the most significant bit generates a carry signal in this stage, that is, addition block 32.

As described above, when input logic signals Am+j and Bm+j have different logical values in all of full adders 50-1-50-n, all the control signals PGm+j from all the full adders 50-1-50-n go to "1". A carry selection control signal generation circuit 30 generates selection control signal SEL of "1" in response to control signal PGm+n from all of full adders 50-1-50-n. In response to the state "1" of control signal SEL, gate circuit TG8 is turned on, while gate circuit TG7' is turned off. Therefore, before carry signal CI from a carry look ahead circuit in a preceding stage is sequentially propagated through the path of full adders 50-1-50-n, the carry signal CI is output through gate circuit TG8 and transmitted to a carry look ahead circuit in a subsequent stage. At this time, with gate circuit TG7' comprising only a single n channel MOS transistor Q2, gate circuit TG8 can transmit carry signal CI from the carry look ahead circuit in the preceding stage to a carry look ahead circuit in the subsequent stage at a high speed.

Figure 22:
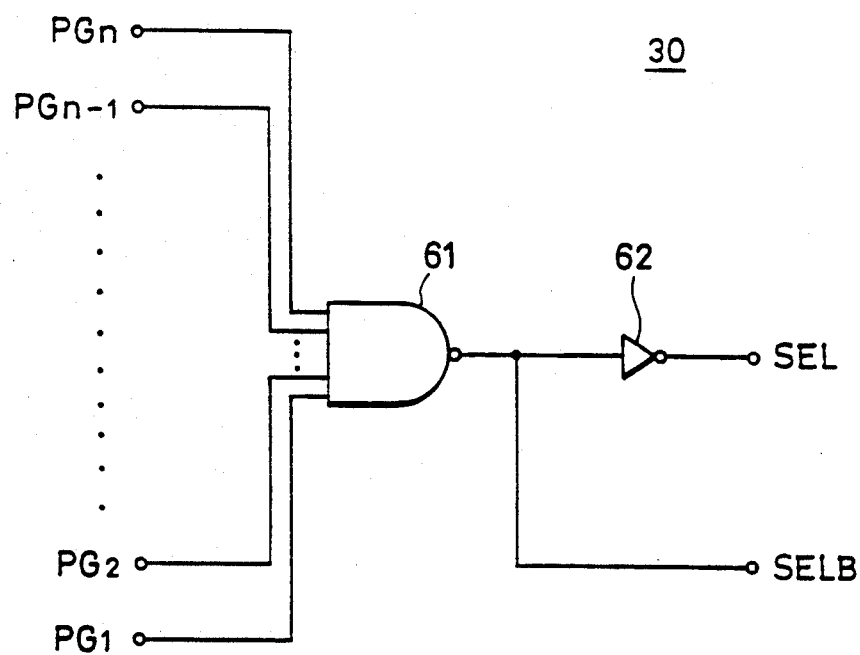
FIG. 22 is a diagram showing one example of a specific construction of the carry selection control signal generation circuit shown in FIG. 21.

FIG. 22 is a diagram showing a specific construction of the carry selection control signal generation circuit 30 shown in FIG. 21. In FIG. 22, carry selection control signal generation circuit 30 comprises an n-input NAND circuit 61 for performing NAND operation on control signals PG1-PGN from n full adders and an inverter circuit 62 for inverting the output of NAND circuit 61 to generate a control signal SEL. NAND circuit 61 generates a control signal SELB. In FIG. 22, control signals PG1-PGn represent control signals from full adders in order to show carry control signals with respect to carry look ahead circuits in all the stages in common. Control signals PG1-PGn correspond to control signals PGm+1-PGm+n in the arrangement of FIG. 21. As shown in FIG. 22, carry selection control signal generation circuit 30 generates control signal SEL of "1" when all the control signals PG1-PGn are at "1".

Herein, generation of a control signal PGj implies that whether a carry is generated in a corresponding full adder or not is determined by a carry signal from a full adder of its next lower significant bit. Therefore, when all the control signals PG1-PGn are at "1", carry of each of respective full adders in this stage is determined by a carry output of a full adder at each next lower significant bit, which is sequentially transmitted to full adder of more significant bits. In such a state, control signal SEL goes to "1" and a carry signal from a carry look ahead circuit at its next lower significant bit is output as a carry signal of this stage, thereby reducing carry propagation delay. At this time, gate circuit TG8 has its output load capacitance (output load impedance) reduced to allow transmission of this carry signal CI to a carry look ahead circuit in a subsequent stage at a high speed.

Figure 5:
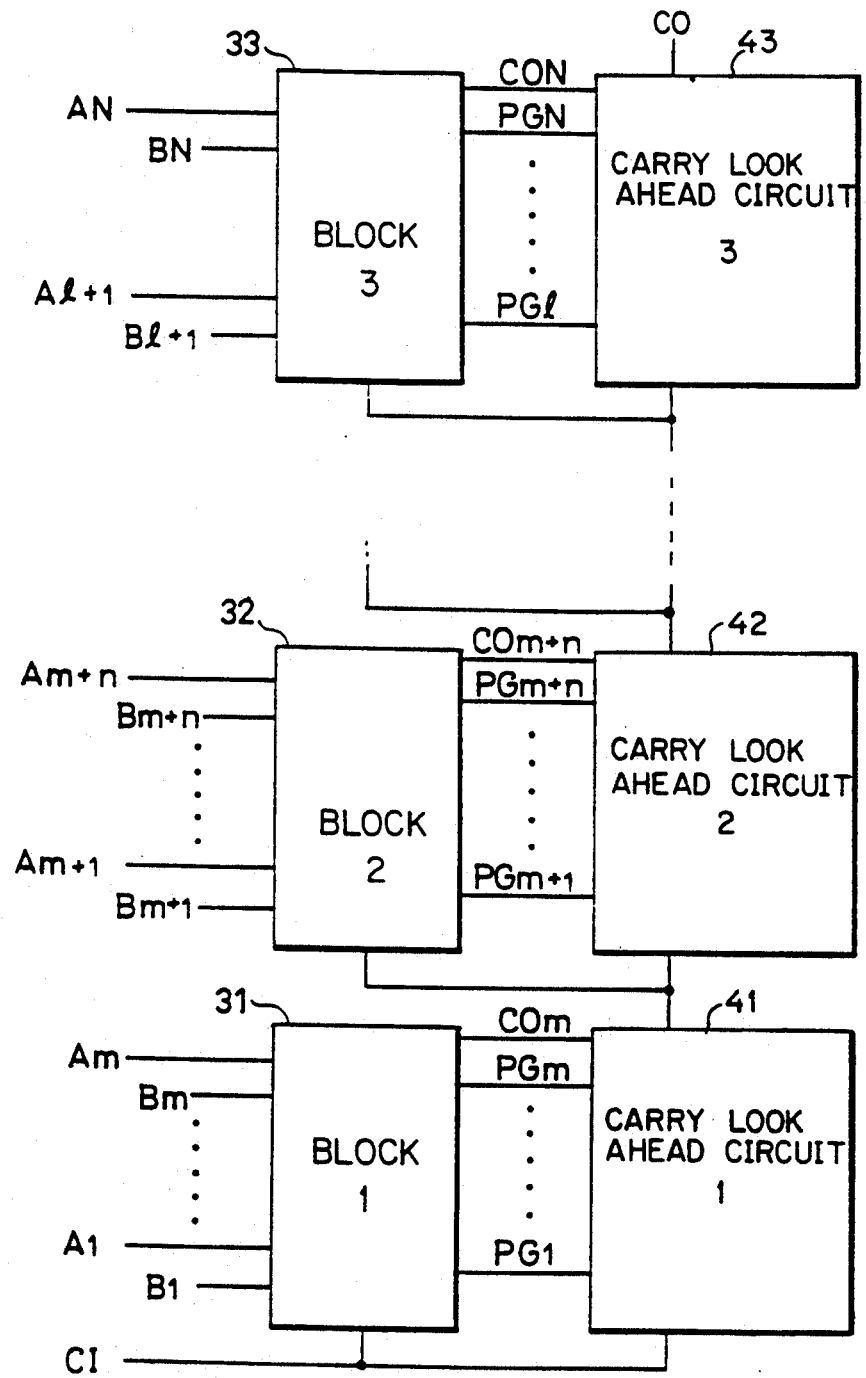
FIG. 5 is a block diagram showing a construction of a conventional N bit addition circuit having a carry look ahead function.

FIG. 23 shows a further arrangement in a semiconductor integrated circuit device according to the present invention, which provides an improvement to the conventional semiconductor integrated circuit shown in FIG. 5. FIG. 23 shows a distribution of gate width of transistor Q2 of gate circuit TG7' included in a carry look ahead circuit in a case where an N bit addition circuit is divided into 10 stages. The carry look ahead circuit #1 is provided corresponding to an addition block in a first stage and a carry look ahead circuit #10 is provided corresponding to an addition block in the final stage. W represents a unit gate width. A gate width of transistor Q2 included in gate circuit TG7' of the first stage carry look ahead circuit is 10 W. The more significant a bit becomes at which a carry look ahead circuit is provided corresponding to an addition block, the smaller the gate width of transistor Q2 of gate circuit TG7' becomes. As shown in FIG. 23, a carry look ahead circuit at a more significant bit is allowed to transmit a carry signal from a less significant bit at a high speed to reduce carry signal propagation delay by sequentially reducing the gate widths of transistors Q2 of gate circuits TG7' in the carry look ahead circuits.

FIG. 24 is a table showing another distribution of gate width of transistor Q2 in gate circuit TG7' of the carry look ahead circuits. In FIG. 24, the carry look ahead circuit is divided into two groups, wherein a gate width of transistor Q2 of gate circuit TG7' is set to 10 W for carry look ahead circuits #1 to #5 of least significant bits and the gate width of transistor Q2 of gate circuit TG7' is set to 5 W for carry look ahead circuits #6 to #10 of most significant bits. In both of FIGS. 23 and 24, carry signal propagation delay through gate circuit TG8 of a carry look ahead circuit becomes smaller as the bit order becomes higher.

In a carry look ahead circuit for a more significant bit, a gate width of transistor Q2 of gate circuit TG7' is small, that is, a transistor size is reduced and so-called current drivability may be reduced to slightly increase signal propagation delay. However, even if propagation time of a carry signal at a more significant bit is slightly increased, propagation characteristics of the carry signal in that stage is determined by a propagation time required for a carry signal generated from the least significant bit in that stage to be propagated through all the adders therein. In this case, the carry look ahead circuit outputs the carry signal to the subsequent stage through gate circuit TG8, avoiding an adverse affect on the performance of the addition circuit. In particular, by reducing load capacitance (load impedance) of the output portion of gate circuit TG7', it is possible to transmit a carry signal from a preceding stage to a carry look ahead circuit and an addition block in a subsequent stage through gate circuit TG8 at a high speed.

Figure 7:
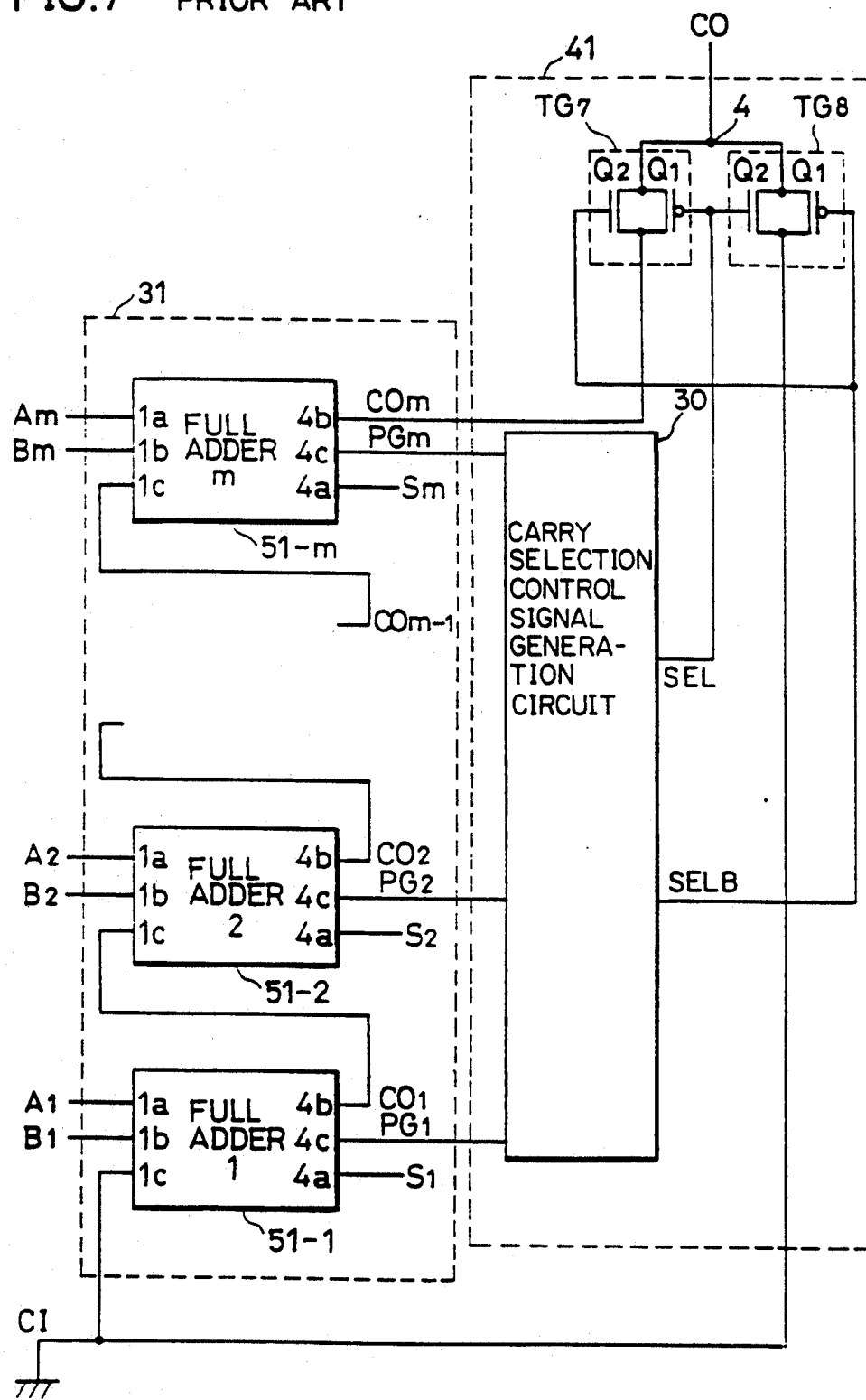
FIG. 7 is a diagram showing a construction of a first stage of the N bit addition circuit shown in FIG. 5.
Figure 25:
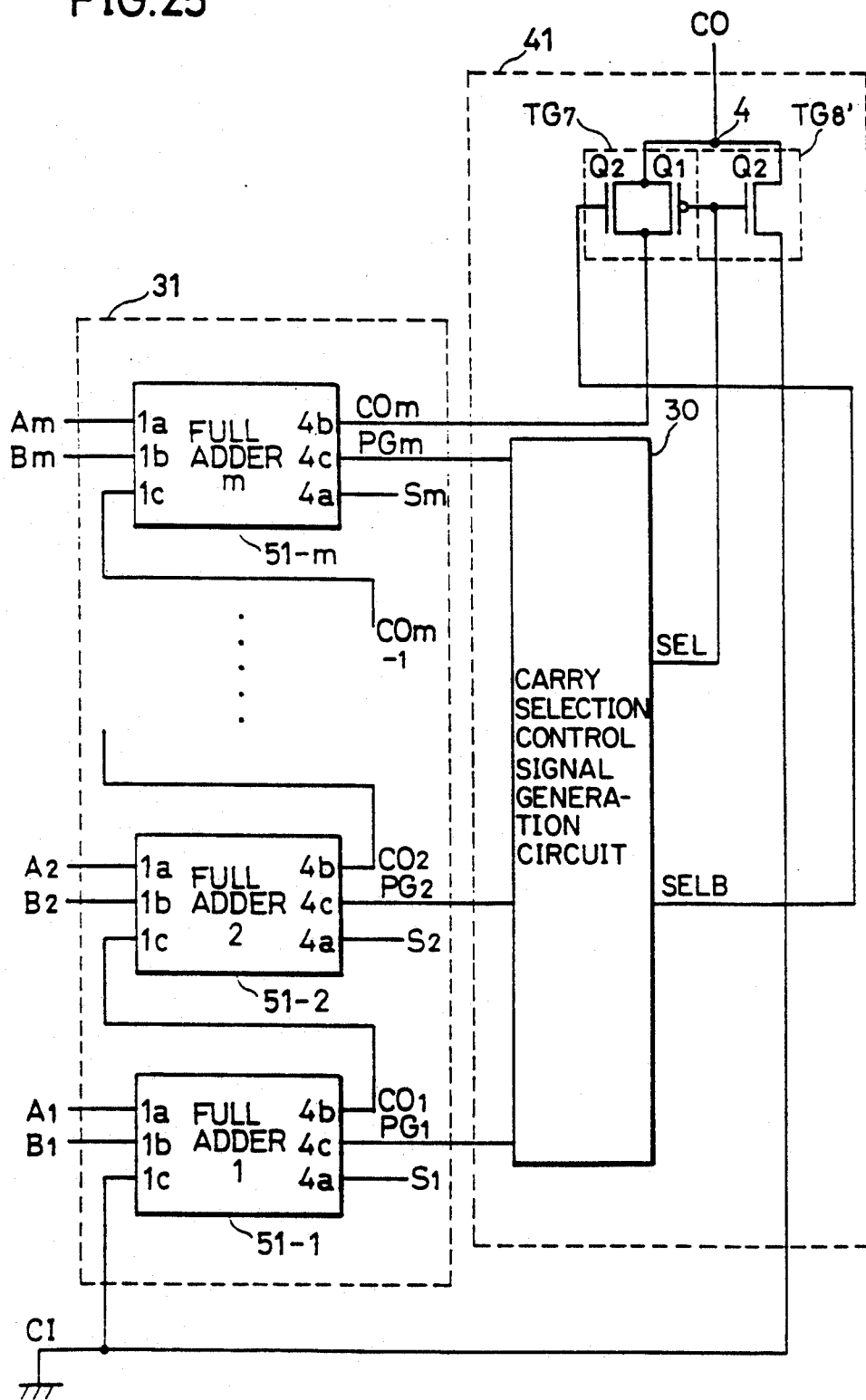
FIG. 25 is a diagram showing a construction of a block in a first stage of the N bit full addition circuit having a carry look ahead function according to the present invention.

FIG. 25 is a diagram showing still further another construction of a semiconductor integrated circuit according to the present invention, which provides an improvement to the semiconductor integrated circuit shown in FIG. 7. In FIG. 25, the same reference numerals are allotted to the portions corresponding to those of the semiconductor integrated circuit shown in FIG. 7. The semiconductor integrated circuit shown in FIG. 25 is identical to the semiconductor integrated circuit shown in FIG. 7 excluding that a gate circuit TG8' for transmitting a carry signal CI fixed to a certain logical value (0) comprises a single n channel MOS transistor. In a carry look ahead circuit 41 provided corresponding to an addition block 31 in the first stage, a carry signal CI is fixed to logic "0" and a carry output can be transmitted to an output node 4 at a high speed. Control signal SEL being at "1" implies that in addition block 31, all full adders 51-1–51-m have addition outputs determined by carry signals from full adders of their respective next lower significant bits. Therefore, carry signal COm output from full adder 51-m for the most significant bit has the same logical value as that of carry signal CI. In this case, therefore, gate circuit TG8, is turned on to transmit the signal to a carry look ahead circuit and an addition block in the subsequent stage.

Control signal SELB being at "1" implies that at least one of control signals PG1–PGm is at logic "0". In this case, a propagation chain of a carry signal is cut-off at a certain full adder and a logical value of a carry signal of addition block 31 is determined by full adder 51-m for the most significant bit. In this case, therefore, gate circuit TG7 is turned on. With gate circuit TG8' comprising only a single n channel MOS transistor, gate circuit TG7 is allowed to transmit the carry signal COm to an addition block and a carry look ahead circuit in a higher order stage (the second order stage) at a high speed.

Characteristic technical effects produced by the present invention are as follows.

A first gate circuit for receiving an input signal to be transmitted at a high speed comprises a parallel circuit including a p channel MOS transistor and an n channel MOS transistor and a second gate circuit for receiving an input signal whose level is fixed or which is not so required to be transmitted at a high speed comprises for example, a single MOS transistor, whereby the size of a semiconductor integrated circuit is reduced and output load capacitance (impedance) viewed from the output of the second gate circuit is reduced to enable high-speed transmission of a signal to be transmitted at a high speed.

In an N bit parallel addition circuit, a first gate circuit for receiving a carry signal from a next lower significant bit to be transmitted at a high speed comprises, for example, a parallel circuit including a p channel MOS transistor and an n channel MOS transistor and a second gate circuit for receiving first or second logic signal indicative of an augend comprises, for example, a single MOS transistor, resulting in reduction of a circuit size of an n bit addition circuit and in high-speed transmission of a carry signal from a next lower significant bit to a subsequent stage.

Since a parallel addition circuit is structured such that a first gate circuit for receiving a first logic signal or a second logic signal of the least significant bit to be transmitted faster than a carry input signal whose level is fixed from a less significant bit order comprises a parallel circuit of a p channel MOS transistor and an n channel MOS transistor, for example, and a second gate circuit for receiving the carry input signal comprises a single MOS transistor, for example, a circuit size can be reduced and a carry signal generated from a full adder of the least significant bit can be transmitted to a subsequent stage at a high speed.

Since in a binary addition circuit having a carry look ahead function for a parallel binary addition arrangement of at least 3 bits, a first gate circuit for receiving a carry signal from a carry look ahead circuit at a next lower order stage comprises a parallel circuit of a p channel MOS transistor and an n channel MOS transistor, for example, and a second gate circuit for receiving a carry output signal from a full adder of the most significant bit in an addition block provided corresponding to one carry look ahead circuit comprises only a single MOS transistor, for example, it is possible to reduce a circuit size and to transmit a carry signal from the carry look ahead circuit in the next lower stage to a carry look ahead circuit in the subsequent stage at a high speed.

Since in a binary addition circuit having a carry look ahead function for a parallel binary addition of at least 3 bits, a first gate circuit for receiving a carry signal from a full adder of the most significant bit in an addition block in a stage comprises a parallel circuit of a p channel MOS transistor and an n channel MOS transistor, for example, and a second gate circuit for receiving a carry signal to be applied to a full adder of the least significant bit in this addition block comprises only a single MOS transistor, for example, it is possible to reduce a circuit size and to transmit a carry output signal from the full adder of the most significant bit in this block, as a carry signal of this block to a subsequent stage at a high speed, thereby drastically reducing carry signal propagation delay to implement a high-speed binary addition circuit.

As described above, the present invention enables reduction of load capacitance (load impedance) of a path for propagating a signal to be transmitted at a high speed, thereby increasing performance in speed of a logic circuit using MOS transistor as a transmission gate. That is, it is possible to improve performance in speed of a semiconductor integrated circuit comprising a logic circuit using such a gate circuit for signal transmission including such an MOS transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device for selectively transmitting an input signal, out of a plurality of input signals, to an output node in response to a selection signal, comprising:

first gate means connected to a first input node for transmitting a first input signal applied to said first input node to said output node in response to said selection signal, said first gate means having first load capacitance viewed from said output node, and second gate means connected to a second input node for transmitting a second input signal applied to said second input node to said output node in response to said selection signal, said second gate means having second load capacitance viewed from said output node, said second load capacitance being smaller than said first load capacitance said first gate means having a smaller delay period than said second gate means.

2. The semiconductor integrated circuit device according to claim 1, wherein said first gate means comprises a parallel connection of a first conductivity type insulated gate type field effect transistor and a second conductivity type insulated gate type field effect transistor, and said second gate means comprises a single insulated gate type field effect transistor.

3. The semiconductor integrated circuit device according to claim 1, further comprising:

third gate means provided in parallel with said first gate means for transmitting a third input signal different from said first input signal to said output node, said third gate means having third output load capacitance viewed from said output node, said third load capacitance having a value substantially equal to that of said first load capacitance, and fourth gate means provided in parallel with said second gate means for selectively transmitting a fourth input signal different from said second input signal to said output node, said fourth gate means having fourth output load capacitance viewed from said output node, said fourth output load capacitance having a value substantially equal to that of said second output load capacitance.

4. The semiconductor integrated circuit device according to claim 1, further comprising N full adders for adding N bit binary numbers, N being an integer and each of said full adders including a carry input and a carry output, wherein said first gate means receives a signal generated at a carry output of a full adder corresponding to the most significant bits of said N bit binary numbers as said first input signal, and said second gate means receives a signal applied to a carry input of a full adder corresponding to the least significant bits of said N bit binary numbers as said second input signal.

5. The semiconductor integrated circuit device according to claim 1, further comprising N 2-bit full adders for adding binary numbers of N bits, N being an integer and each of said full adders including a carry input and a carry output, wherein said first gate means receives a signal applied to a carry input of a full adder corresponding to the most significant bit of said N bits as said first input signal, and said second gate means receives a signal generated at a carry output of a full adder corresponding to the most significant bit of said N bits as said second input signal.

6. The semiconductor integrated circuit device according to claim 4, wherein each of said full adders includes detecting means for detecting coincidence and non-coincidence of logics of applied signals, said semiconductor integrated circuit further comprising logic means for receiving output signals of said detecting means of all of said full adders and performing a logical product operation of the received signals, an output signal of said logic means being used as said selection signal.

7. The semiconductor integrated circuit device according to claim 4, wherein a logical level of the signal applied said carry input as said second input signal is fixed at a predetermined level.

8. The semiconductor integrated circuit device according to claim 5, each of said full adders includes detecting means for detecting coincidence and non-coincidence of logics of applied signals, said semiconductor integrated circuit device further comprising means for receiving outputs of said detecting means of all said full adders and performing a logical operation of the received signals to generate said selection signal.

9. The semiconductor integrated circuit device according to claim 5, wherein a logical level of a signal applied to said carrier input as said first input signal is variable.

10. The semiconductor integrated circuit device according to claim 1, further comprising detecting means for detecting coincidence and non-coincidence in logic of a first logic signal and a second logic signal, and a third input node for receiving a third logic signal, wherein said first gate means receiving an output of said detecting means as said selection signal to selectively pass said third logic signal applied to said third input node as said first input signal, and said second gate means receives an output of said detecting means as said selection signal and selectively passes said first logic signal as said second input signal.

11. The semiconductor integrated circuit device according to claim 10, wherein a logical level of said third logic signal is variable.

12. The semiconductor integrated circuit device according to claim 1, further comprising detecting means for detecting coincidence and non-coincidence of a first logic signal and a second logic signal, and a third input node for receiving a third logic signal, wherein
    said first gate means receives said first logic signal as said first input signal and selectively passes a received signal by using an output of said detecting means as said selection signal, and
    said second gate means receives said third logic signal applied to said third input node and selectively passes thus received signal by using the output of said detecting means as said selection signal.

13. The semiconductor integrated circuit device according to claim 12, wherein the logical level of said third logic signal is set at a predetermined level.

14. The semiconductor integrated circuit device according to claim 10 or 12, wherein said detecting means includes:
    a first transmission gate responsive to said first logic signal for selectively passing said second logic signal, and
    a second transmission gate in responsive to said first logic signal for selectively passing an inversion signal of said second logic signal, said first and second transmission gates being complementarily turned on and off,
    output terminals of said first and second transmission gates being coupled to the non-coincidence detection signal output node in common, and
    said output terminals of said first and second transmission gates being connected to the coincidence detection signal output node through an inverter.

15. A semiconductor integrated circuit device for adding a first logic signal, a second logic signal and a third logic signal respectively applied to a first input node, a second input node and a third input node and outputting a fourth logic signal and a fifth logic signal related to logical values of a first order digit and a second order digit of the result of the addition to a first output node and a second output node, respectively, said circuit device comprising:
    control signal generating means for detecting coincidence and non-coincidence of the logical values of said first and second logic signals to generate an coincidence and non-coincidence instruction signal indicative of the result of the detection result,
    first gate means connected to said first output node and responsive to said coincidence and non-coincidence instruction signal for transmitting an inversion signal of said third logic signal to said first output node,
    second gate means connected to said first output node and responsive to said coincidence/non-coincidence instruction signal for transmitting said third logic signal to said first output node, said second gate means being turned on complementarily to said first gate means,
    third gate means connected to said second output node and responsive to said coincidence/non-coincidence instruction signal for transmitting a signal corresponding to said first logic signal to said second output node, and
    fourth gate means connected to said second output node and responsive to said coincidence/non-coincidence instruction signal for transmitting a signal corresponding to said third logic signal to said second output node, said second gate means and said fourth gate means being turned on substantially at the same time and said third and fourth gate means being turned on complementarily to each other,
    load capacitance of said third gate means viewed from said second output node being smaller than load capacitance of said fourth gate means viewed from said second output node.

16. The semiconductor integrated circuit device according to claim 15, wherein
    said third gate means includes one insulated gate type field effect transistor, and
    said fourth gate means includes a p channel insulated gate type field effect transistor and an n channel insulated gate type field effect transistor connected in parallel to each other.

17. The semiconductor integrated circuit device according to claim 15, wherein load capacitance of said first gate means viewed from said first output node is equal to load capacitance of said second gate means viewed from said first output node.

18. The semiconductor integrated circuit device according to claim 16, wherein said first and second gate means both include one insulated gate type field effect transistor.

19. The semiconductor integrated circuit device according to claim 16, wherein both of said first and second gate means include a p channel insulated gate type field effect transistor and an n channel insulated gate type field effect transistor connected in parallel to each other.

20. The semiconductor integrated circuit device according to claim 15, wherein said control signal generating means includes:
    a first transmission gate responsive to said first logic signal for selectively passing said second logic signal, and
    a second transmission gate responsive to said first logic signal for selectively passing an inversion signal of said second logic signal, said first and second transmission gates being complementarily turned on and off,
    output terminals of said first and second transmission gates being coupled to a non-coincidence detection signal output node in common, and
    said output terminals of said first and second transmission gates being also connected to a coincidence detection signal output node through an inverter.

21. The semiconductor integrated circuit device according to claim 15, wherein
    said first logic signal is a signal for a k-th bit of a first binary number of N bits, and
    said second logic signal is a signal for a k-th bit of a second binary number of N bits, N being an integer and $2 \leq k \leq N$,
    said third logic signal is a signal applied from the second output node of an integrated circuit device provided corresponding to a signal for (k−1)-th bit, said N bits,
    load capacitance of third gate means in the integrated circuit provided corresponding to first and second logic signals for m-th bit of said N bits viewed from a second output node is smaller than load capacitance of third gate means in the integrated circuit provided corresponding to first and second logic signals for n-th of said N bits bit viewed from said second output node, wherein $1 \leq m < n \leq N$.

22. A semiconductor integrated circuit device for adding a first logic signal, a second logic signal and a third logic signal respectively applied to a first input node, a second input node and a third input node to output a fourth logic signal and a fifth logic signal related to logical values of a first order digit and a second order digit of the result of the addition to a first output node and a second output node, respectively, said circuit comprising:

control signal generating means for detecting coincidence and non-coincidence of said first an second logic signals to generate a coincidence/non-coincidence instruction signal indicative of the result of the detection, first gate means connected to said first output node and responsive to said coincidence/noncoincidence instruction signal for transmitting an inversion signal of said third logic signal to said first output node, second gate means connected to said first output node and responsive to said coincidence/noncoincidence instruction signal for transmitting said third logic signal to said first output node, said second gate means being turned on complementarily to said first gate means, third gate means connected to said second output node and responsive to said coincidence/non-coincidence instruction signal for transmitting a signal corresponding to said first logic signal to said second output node, and fourth gate means connected to said second output node and responsive to said coincidence/noncoincidence instruction signal for transmitting a signal corresponding to said third logic signal to said second output node, said second gate means and said fourth gate means being turned on substantially at the same time, said third and fourth gate means being turned on complementarily to each other and load capacitance of said fourth gate means viewed from said second output node being smaller than load capacitance of said third gate means viewed from said second output node.

23. The semiconductor integrated circuit device according to claim 22, wherein said fourth gate means includes one insulated gate type field effect transistor, and said third gate means includes a p channel insulated gate type field effect transistor and an n channel insulated gate type field effect transistor connected in parallel to each other.

24. The semiconductor integrated circuit device according to claim 22, wherein load capacitance of said first gate means viewed from said first output node is equal to load capacitance of said second gate means viewed from said first output node.

25. The semiconductor integrated circuit device according to claim 23, wherein both of said first and second gate means include one insulated gate type field effect transistor.

26. The semiconductor integrated circuit device according to claim 23, wherein both of said first and second gate means include a p channel insulated gate type field effect transistor and an n channel insulated gate type field effect transistor connected in parallel to each other.

27. The semiconductor integrated circuit device according to claim 22, wherein said control signal generating means includes:

a first transmission gate responsive to said first logic signal for selectively passing said second logic signal, a second transmission gate responsive to said first logic signal for selectively passing an inversion signal of said second logic signal, said first and second transmission gates being complementarily turned on and off, output terminals of said first and second transmission gates being coupled to a noncoincidence detection signal output node in common, and said output terminals of said first and second transmission gates being also connected to a coincidence detection signal output node through an inverter.

28. The semiconductor integrated circuit device according to claim 22, wherein the logical level of said third logic signal is set at a predetermined level.

29. The semiconductor integrated circuit device according to claim 22, said semiconductor integrated circuit comprises a full adder circuit provided for the least significant bit in a full adders for N bit binary numbers.

30. A semiconductor integrated circuit device for adding multi-bit binary numbers, comprising:

a plurality of full adders provided in parallel to each other, each of said plurality of full adders including:

first and second input nodes for respectively receiving first and second logic signals indicative of the values of corresponding bits in said multi-bit binary numbers, a third input node for receiving a carry signal from a full adder for a next less significant bit, a first output node for outputting a carry signal obtained from an addition of signals applied to said first, second and third input nodes, and a second output node for outputting a carry propagation instruction signal indicating whether a carry signal applied to said third input node is to be transmitted to said first output node, control signal generating means responsive to carry propagation instruction signals from all of said plurality of full adders for generating a selection control signals, first gate means responsive to said selection control signal for transmitting the carry signal applied to said third input node of a full adder for the least significant bit, out of said plurality of full adders, to said third output node, and second gate means responsive to said selection control signal for transmitting the carry signal from said first output node of a full adder for the most significant bit, out of said plurality of full adders, to said third output node, said first gate means and said second gate means being turned on complementarily to each other, and load capacitance of said second gate means viewed from said third output node being smaller than load capacitance of said first gate means viewed from said third output node.

31. The semiconductor integrated circuit device according to claim 30, wherein said first gate means includes one insulated gate field effect transistor, and said second gate means includes a p channel insulated gate type field effect transistor and an n channel insulated gate type field effect transistor connected in parallel to each other.

32. The semiconductor integrated circuit device according to claim 30, wherein
said multi-bit binary numbers are divided into M groups, each group including at least three bits and M being an integer,
said semiconductor integrated circuit device being provided corresponding to one of said M groups, and wherein
load capacitance of said second gate means in a semiconductor integrated circuit device provided corresponding to an m-th group viewed from said output node is set to be smaller than that of second gate means in a semiconductor integrated circuit device provided corresponding to an n-th group, $1 \leq n < m \leq M$ and the M-th group is a group for the most significant bit of said multi-bit binary numbers.

33. A semiconductor integrated circuit device for adding multi-bit binary numbers, comprising:
a plurality of full adders, each of said plurality of full adders including:
first and second input nodes for receiving first and second logic signals indicative of the values of corresponding bits of said multi-bit binary numbers,
a third input node for receiving a carry signal for a full adder from a less significant bit,
a first output node for outputting a carry signal obtained from an addition of the signals applied to said first, second and third input nodes, and
a second output node for outputting a carry propagation instruction signal indicating whether the carry signal applied to said third input node is to be transmitted to said first output node, said third input node of a full adder for the least significant bits of said multi-bit binary numbers being supplied with a carry signal having a predetermined logical value,
control signal generating means responsive to said carry propagation instruction signals from all of said plurality of full adders for generating a selection control signal,
first gate means responsive to said selection signal for transmitting said carry signal applied to said third input node of the full adder for said least significant bit, out of said plurality of full adders, to said third output node, and
second gate means responsive to said selection control signal for transmitting the carry signal from said first output node of the full adder for the most significant bit, out of said plurality of full adders, to said third output node,
said first gate means and said second gate means being turned on complementarily to each other and load capacitance of said first gate means viewed from said third output node being smaller than load capacitance of said second gate means viewed from said third output node.

34. The semiconductor integrated circuit device according to claim 33, wherein
said first gate means includes one insulated gate type field effect transistor, and
said second gate means includes a p channel insulated gate type field effect transistor and an n channel insulated gate type field effect transistor connected in parallel to each other.

35. A semiconductor integrated circuit device including a selection circuit responsive to a selection control signal for selectively passing either of first and second logic signals, comprising:
a CMOS transmission gate responsive to said selection control signal for transmitting said first logic signal to a common node, and
a MOS transfer gate responsive to said selection control signal for transmitting said second logic signal to said common node,
said CMOS transmission gate and said MOS transfer gate being turned on and off complementarily to each other said CMOS transmission gate having a smaller delay period than said MOS transfer gate.

36. A semiconductor integrated circuit device for selectively transmitting an input signal, out of a plurality of input signals, to an output node in response to a selection signal, comprising:
first gate means connected to a first input node for transmitting a first input signal applied to said first input node to said output node in response to said selection signal, said first gate means having first load capacitance viewed from said output node;
second gate means connected to a second input node for transmitting a second input signal applied to said second input node to said output node in response to said selection signal, said second gate means having second load capacitance viewed from said output node, said second load capacitance being smaller than said first load capacitance;
third gate means provided in parallel with said first gate means for transmitting a third input signal different from said first input signal to said output node, said third gate means having third output load capacitance viewed from said output node, said third load capacitance having a value substantially equal to that of said first load capacitance; and
fourth gate means provided in parallel with said second gate means for selectively transmitting a fourth input signal different from said second input signal to said output node, said fourth gate means having fourth output load capacitance viewed from said output node, said fourth output load capacitance having a value substantially equal to that of said second output load capacitance.

37. A semiconductor integrated circuit device comprising:
N full adders for adding N bit binary numbers, N being an integer and each of said full adders including a carry input and a carry output;
first gate means connected to receive a first signal generated at a carry output of a full adder corresponding to the most significant bits of said N bit binary numbers for transmitting the first signal to an output node in response to a selection signal, said first gate means having first load capacitance viewed from said output node; and
second gate means connected to receive a second signal applied to a carry input of a full adder corresponding to the least significant bits of said N bit binary numbers for transmitting the second signal to said output node in response to said selection signal, said second gate means having second load capacitance viewed rom said output node, said second load capacitance being smaller than said first load capacitance.

38. A semiconductor integrated circuit device comprising:

detecting means for detecting coincidence and non-coincidence in logic of a first logic signal and a second logic signal respectively received at a first and a second input node;

a third input node for receiving a third logic signal;

first gate means response to an output of said detecting means for passing said third logic signal to an output node, said first gate means having first load capacitance viewed from said output node; and second gate means responsive to the output of said detecting means for passing said first logic signal to said output node, said second gate means having second load capacitance viewed from said output node, said second load capacitance being smaller than said first load capacitance.

39. A semiconductor integrated circuit device comprising:

detecting means for detecting coincidence and non-coincidence of a first logic signal and a second logic signal respectively received at a first and a second input node;

a third input node for receiving a third input node;

first gate means responsive to an output signal of said detecting means for passing said first logic signal to an output node, said first gate means having first load capacitance viewed from said output node; and second gate means responsive to the output signal of said detecting signal for passing said third logic signal to said output node, said second gate means having second load capacitance viewed from said output node, said second load capacitance being smaller than said first load capacitance.

40. The semiconductor integrated circuit device according to claim 38 wherein said detecting means includes:

a first transmission gate responsive to said first logic signal for selectively passing said second logic signal, and a second transmission gate responsive to said first logic signal for selectively passing an inversion signal of said second logic signal, said first and second transmission gates being complementarily turned on and off, output terminals of said first and second transmission gates being coupled to the non-coincidence detection signal output node in common, and said output terminals of said first and second transmission gates being connected to the coincidence detection signal output node through an inverter.

41. The semiconductor integrated circuit device according to claim 39, wherein the logical level of said third logic signal is set at a predetermined level.

* * * * *